(12) United States Patent
Ching et al.

(10) Patent No.: US 9,666,581 B2
(45) Date of Patent: May 30, 2017

(54) FINFET WITH SOURCE/DRAIN STRUCTURE AND METHOD OF FABRICATION THEREOF

(71) Applicant: Taiwan Semiconductor Manufacturing Company, Ltd., Hsin-Chu (TW)

(72) Inventors: Kuo-Cheng Ching, Hsinchu Couny (TW); Ching-Wei Tsai, Hsin-Chu (TW); Ying-Keung Leung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/832,778

(22) Filed: Aug. 21, 2015

(65) Prior Publication Data

US 2017/0053912 A1 Feb. 23, 2017

(51) Int. Cl.
*H01L 21/02* (2006.01)
*H01L 27/088* (2006.01)
*H01L 21/8234* (2006.01)
*H01L 21/764* (2006.01)
*H01L 29/66* (2006.01)
*H01L 29/165* (2006.01)
*H01L 29/06* (2006.01)
*H01L 29/78* (2006.01)

(52) U.S. Cl.
CPC .... *H01L 27/0886* (2013.01); *H01L 21/02532* (2013.01); *H01L 21/764* (2013.01); *H01L 21/823418* (2013.01); *H01L 21/823431* (2013.01); *H01L 21/823481* (2013.01); *H01L 29/0653* (2013.01); *H01L 29/165* (2013.01); *H01L 29/66636* (2013.01); *H01L 29/7848* (2013.01)

(58) Field of Classification Search
CPC ......... H01L 29/16; H01L 29/48; H01L 29/78; H01L 29/785; H01L 29/417
USPC ........................................................ 438/265
See application file for complete search history.

(56) References Cited

U.S. PATENT DOCUMENTS

| 6,911,383 | B2 * | 6/2005 | Doris | H01L 21/845 257/E21.703 |
|---|---|---|---|---|
| 7,667,271 | B2 | 2/2010 | Yu et al. | |
| 8,362,575 | B2 | 1/2013 | Kwok et al. | |
| 8,367,498 | B2 | 2/2013 | Chang et al. | |
| 8,440,517 | B2 | 5/2013 | Lin et al. | |
| 8,497,528 | B2 | 7/2013 | Lee et al. | |
| 8,610,240 | B2 | 12/2013 | Lee et al. | |
| 8,680,576 | B2 | 3/2014 | Ching et al. | |
| 8,723,272 | B2 | 5/2014 | Liu et al. | |

(Continued)

*Primary Examiner* — Michael Lebentritt
(74) *Attorney, Agent, or Firm* — Haynes and Boone, LLP

(57) ABSTRACT

A method of semiconductor fabrication that includes providing a plurality of fins extending from a substrate is described. Each of the plurality of fins has a top surface and two opposing lateral sidewalls. A gate structure is formed over a first region of each of the plurality of fins and interfaces the top surface and the two opposing lateral sidewalls. A source/drain epitaxial feature is formed on a second region of each of the plurality of fins. The source/drain epitaxial feature interfaces the top surface and the two opposing lateral sidewalls. An air gap is provided which is defined by at least one surface of the source/drain epitaxial feature.

18 Claims, 19 Drawing Sheets

(56) References Cited

U.S. PATENT DOCUMENTS

| | | | |
|---|---|---|---|
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,412,850 B1* | 8/2016 | Chuang | H01L 29/66795 |
| 2009/0315112 A1* | 12/2009 | Lee | H01L 21/82343 257/355 |
| 2010/0258870 A1* | 10/2010 | Hsu | H01L 29/785 257/347 |
| 2011/0068407 A1 | 3/2011 | Yeh et al. | |
| 2013/0011983 A1 | 1/2013 | Tsai et al. | |
| 2013/0095629 A1 | 4/2013 | Ando et al. | |
| 2013/0200455 A1* | 8/2013 | Lo | H01L 29/66795 257/347 |
| 2014/0252412 A1 | 9/2014 | Tsai et al. | |
| 2014/0319615 A1* | 10/2014 | Chi | H01L 29/66795 257/365 |
| 2015/0021691 A1 | 1/2015 | Akarvardar et al. | |
| 2015/0035023 A1* | 2/2015 | Kim | H01L 29/785 257/288 |
| 2015/0102393 A1 | 4/2015 | Mieno | |
| 2015/0108430 A1* | 4/2015 | Cheng | H01L 29/66795 257/20 |
| 2015/0243745 A1* | 8/2015 | Kelly | H01L 29/41766 257/369 |
| 2015/0333171 A1* | 11/2015 | Hsu | H01L 29/785 257/347 |
| 2016/0027877 A1* | 1/2016 | Lee | H01L 29/0692 257/191 |

* cited by examiner

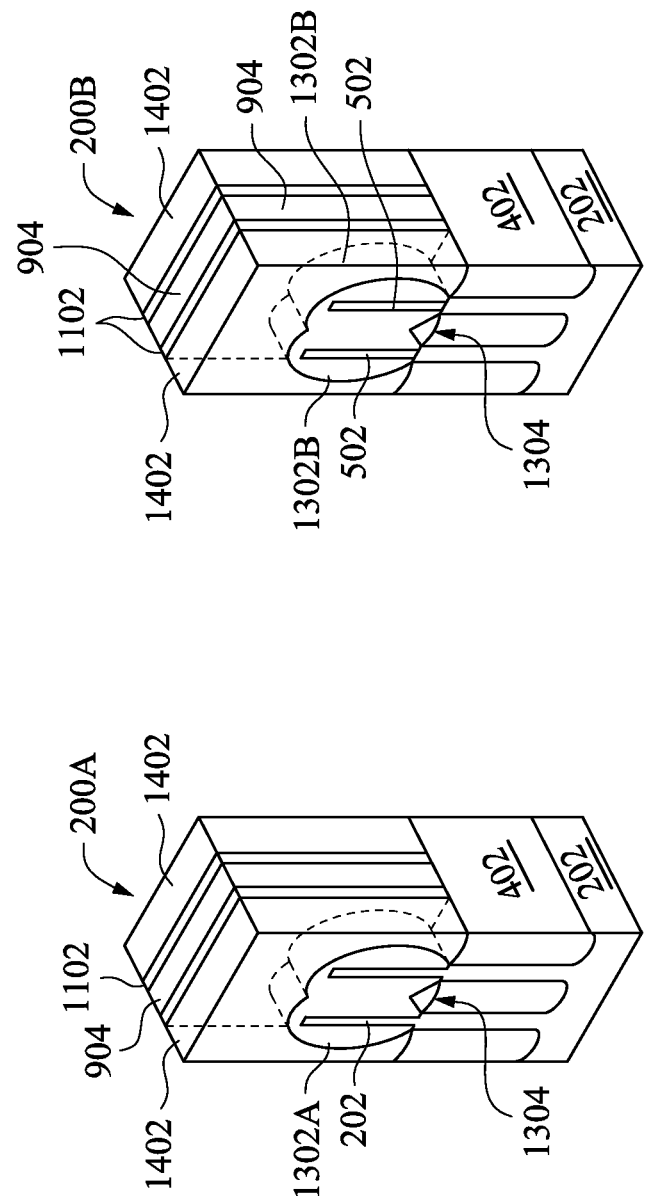

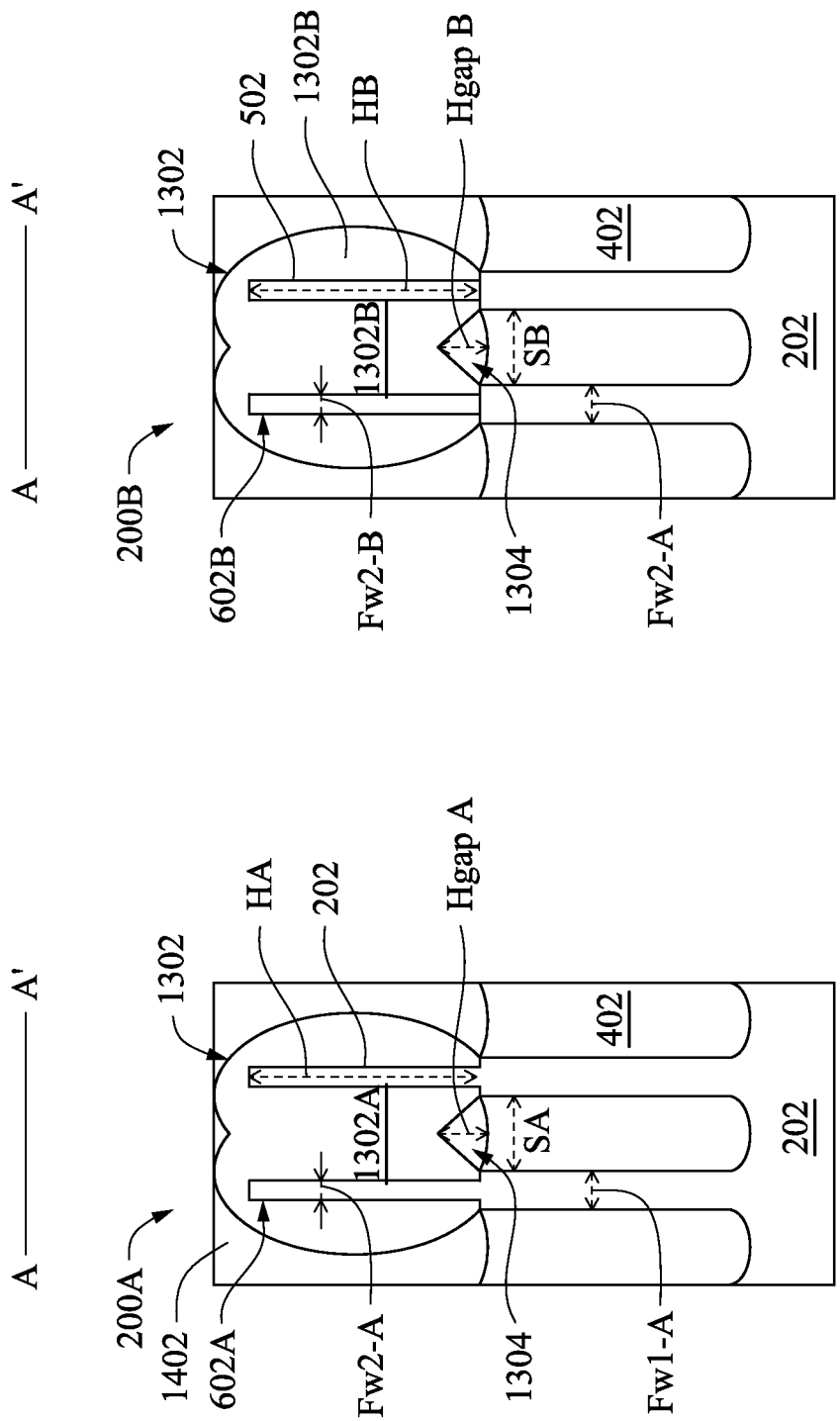

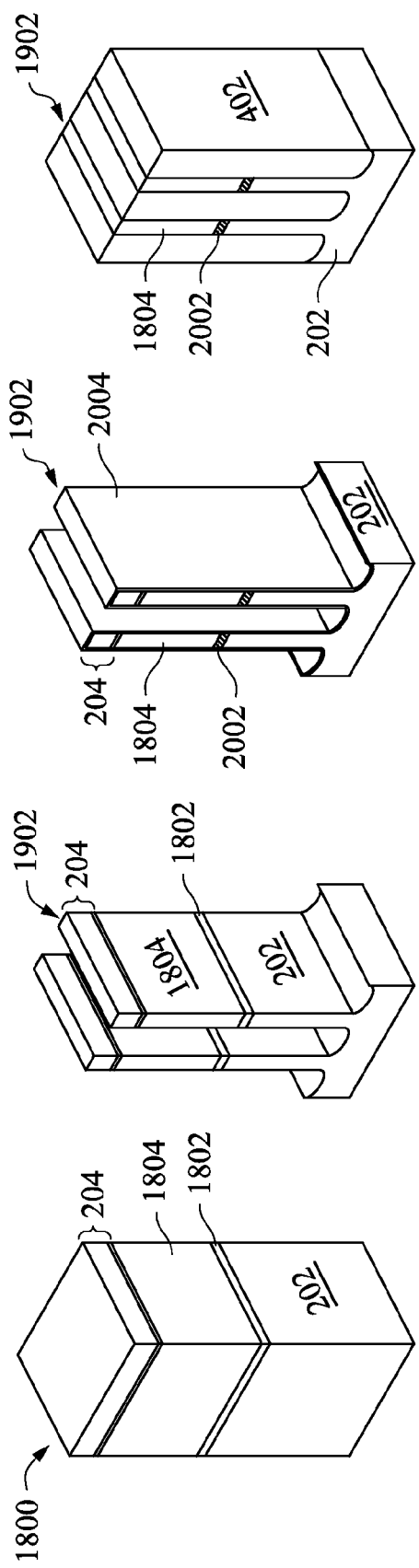

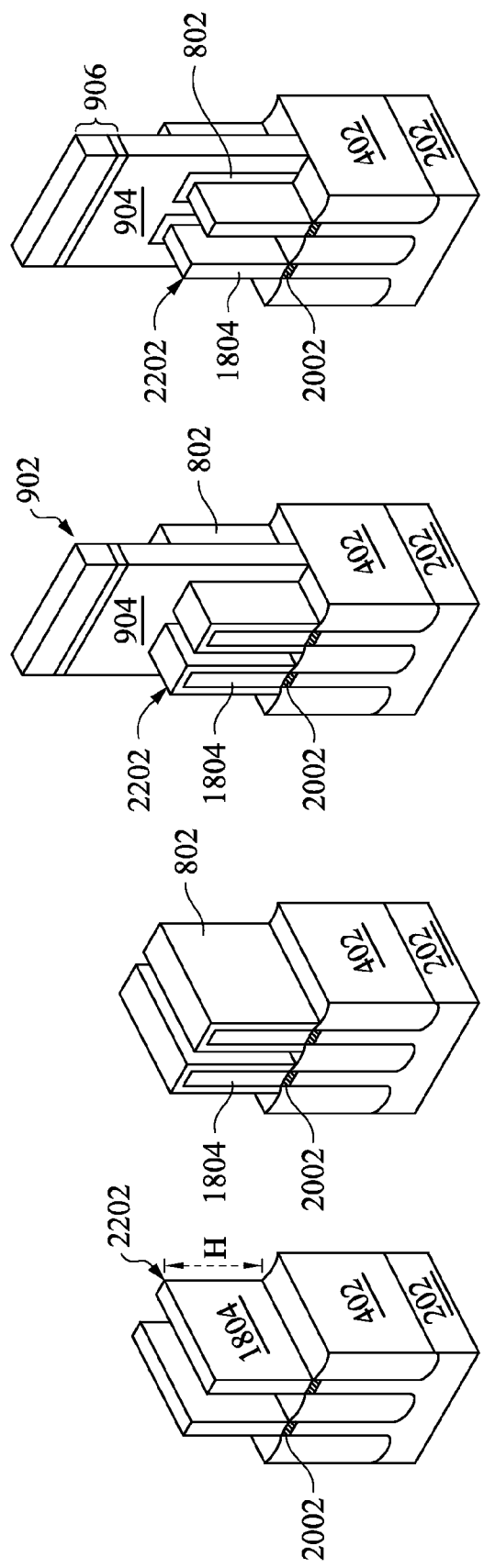

FINFET WITH SOURCE/DRAIN STRUCTURE AND METHOD OF FABRICATION THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In conventional processes, source and drain features may be epitaxially grown in recesses in fins. However, the growth may be inadequate as fins of FinFET devices decrease in pitch and increase in aspect ratio. From example, inadequacies may include voiding in the formed source/drain, which can provide quality impacts to the transistor including resulting in lower channel strain and decreased device mobility. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5A, 5B, 6A, 6B, 7A, 7B, 8A, 8B, 9A, 9B, 10A, 10B, 11A, 11B, 12A, 12B, 13A, 13B, 14A, 14B, 15A, and 15B are isometric views of an embodiment of a device 200 according to aspects of the method of FIG. 1; FIGS. 15C and 15D are cross-sectional views, corresponding to the isometric views of FIGS. 15A and 15B, of an embodiment of the device 200 according to aspects of the method of FIG. 1;

FIGS. 18, 19, 20, 21, 22, 23, 24, 25, 26, 27, 28, 29, and 30 are isometric views of an embodiment of a device 1800 according to aspects of the method of FIG. 15.

DETAILED DESCRIPTION

Figure 1:
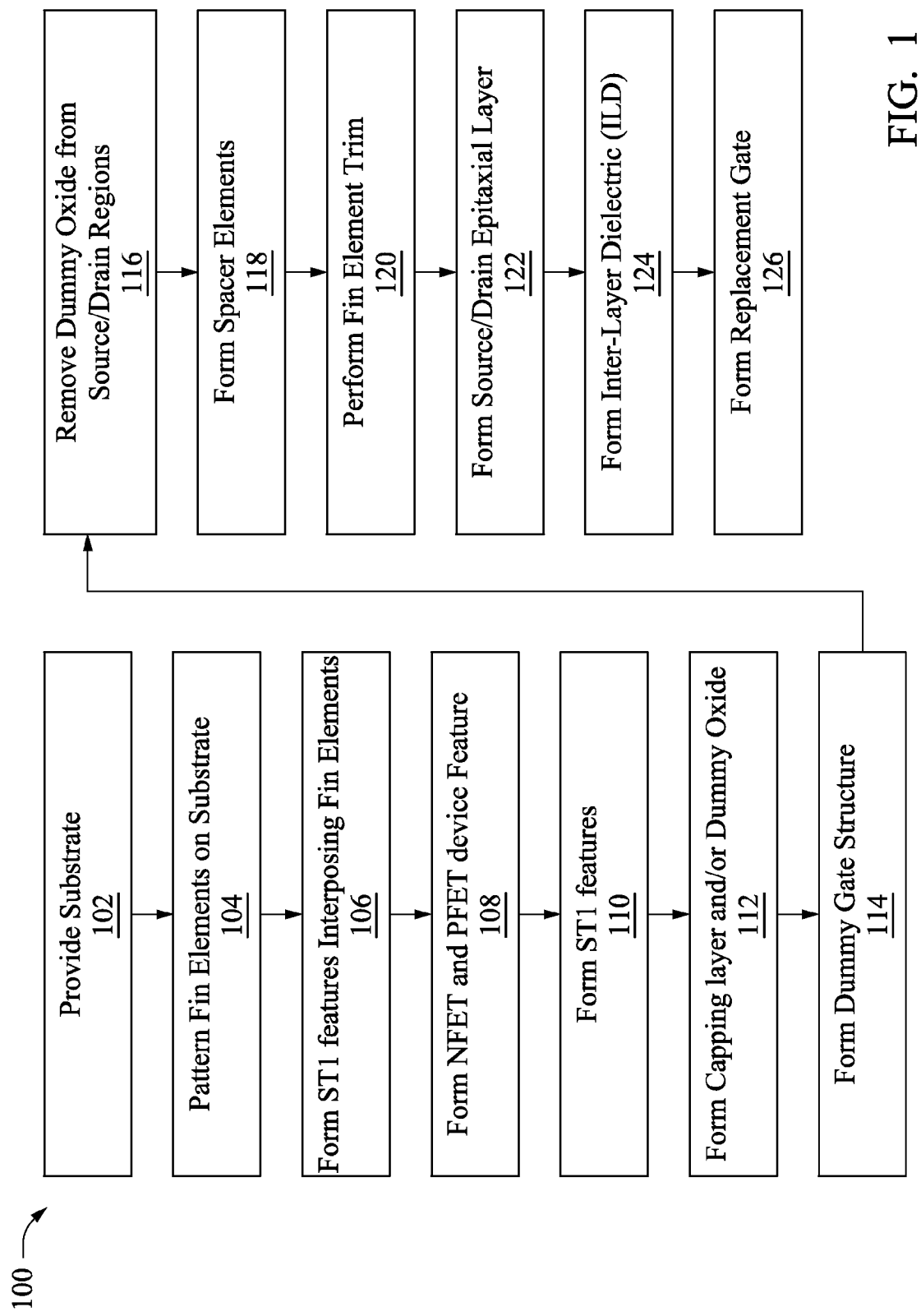
FIG. 1 is a flow chart of a method of fabricating a FinFET device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a method 100 of semiconductor fabrication including fabricating a FinFET device having an epitaxy source/drain feature.

In an embodiment, the FinFET device formed of the method 100, like the method 1700 discussed with reference to FIG. 17, includes a dopant-free channel. As used herein, the term "dopant-free" is used to describe a material having an extrinsic dopant concentration from about 0 $cm^{-3}$ to about $1\times10^{17}$ $cm^{-3}$. In some examples, as used herein, the term "undoped" may be used interchangeably with "dopant-free", having a similar meaning. In some embodiments, the terms may refer to substrate regions, fin regions, or other regions that are not purposefully doped (e.g., by an ion implantation process, diffusion process, or other doping process). In other embodiments, one or more regions of the fin may be doped with a dopant. A "dopant" or "extrinsic dopant", as used herein, is used to describe an impurity (e.g., B, P, As, etc.) that can be introduced into a semiconductor lattice for the purpose of changing the electrical properties of the semiconductor. For example, N-type impurities may be introduced into a semiconductor to form an N-type material, and P-type impurities may be introduced into a semiconductor to form a P-type material.

Also discussed herein is an epitaxially grown material that has a "curvilinear" surface or edge. This may also be referred to as "facet-free." A facet-free material is one with a curvilinear surface and is not intended to imply any lack of crystal orientation or face resulting naturally from the epitaxy growth (e.g., on an atom to atom scale). Rather the resultant surface of the feature can be modified by tuning growth conditions and/or including other processes (e.g., etching) during the growth to control the surface of the epitaxy material such that it has an overall curvilinear shape (e.g., as opposed to having a small number of linear planes defining the surface, such as epitaxy material formed in a diamond shape above a trench).

It is understood that the method 100 includes steps having features of a complementary metal-oxide-semiconductor (CMOS) technology process flow and thus, are only described briefly herein. Additional steps may be performed before, after, and/or during the method 100.

Figure 5A:
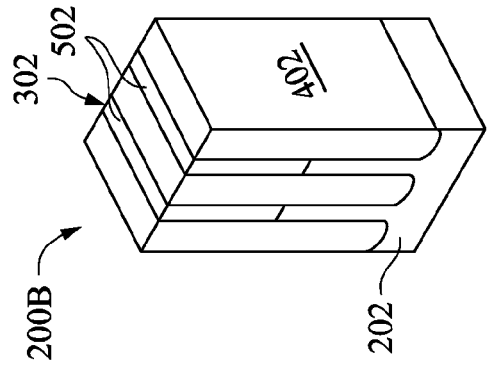
Figure 15B:
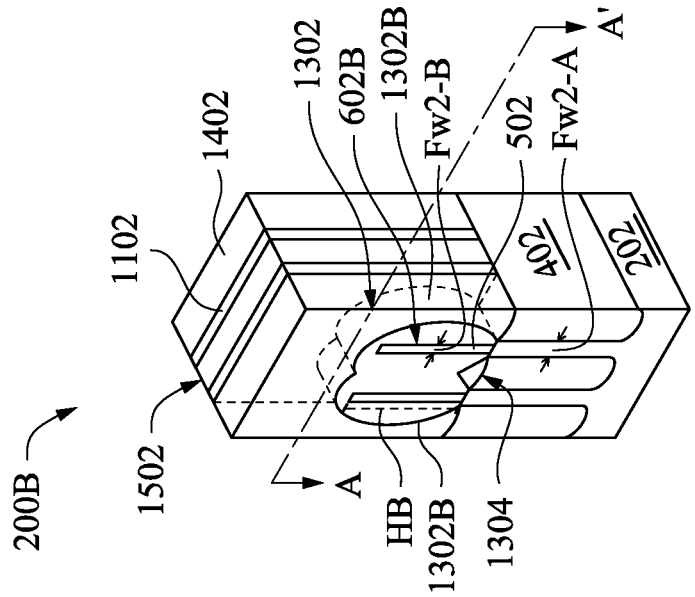

FIGS. 2, 3, 4, 5A, 5B, 6A, 6B, 7A, 7B, 8A, 8B, 9A, 9B, 10A, 10B, 11A, 11B, 12A, 12B, 13A, 13B, 14A, 14B, 15A, and 15B are isometric views of an embodiment of a semiconductor device 200 according to various stages of the method 100 of FIG. 1. FIGS. 15C and 15D are cross-section views, corresponding to respective isometric views of FIGS. 15A and 15B. It is understood that parts of the semiconductor device 200 may be fabricated by a CMOS technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to FIGS. 2-15, are merely exemplary and are not intended to be limiting beyond what is specifically recited in the claims that follow. It is noted that the FIG. designated "A" (e.g., FIG. 5A represents a first type of device (e.g., n-type field effect transistor or NMOS transistor or portion thereof) and the FIG. designated "B" represents a second type of device (e.g., p-type FET or PMOS transistor or portion thereof) at the corresponding stage. Each device type, e.g., that represented by the "A" figure and that represented by the "B" figure may be formed on the same substrate (e.g., substrate 202). One or more isolation features (e.g., STI) may interpose the devices of a first type from those of a second type.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. In some embodiments, the substrate 202 may include various layers, including conductive or insulating layers, formed on a semiconductor substrate. In some embodiments, the substrate 202 is a contiguous silicon substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Figure 2:
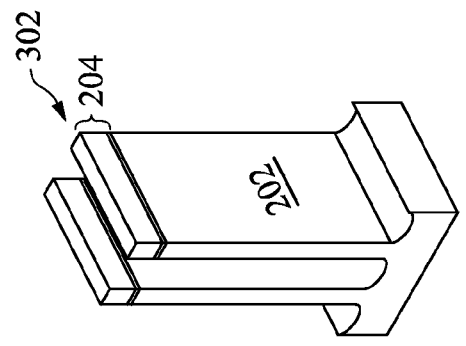
Figure 3:
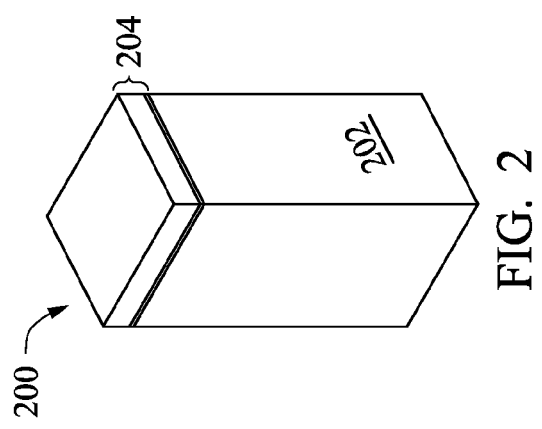

In the example of FIG. 2, in an embodiment of block 102, the substrate 202 includes a hard mask layer 204 disposed thereon. The hard mask layer 204 may include an oxide layer (e.g., a pad oxide layer that may include $SiO_2$) and nitride layer (e.g., a pad nitride layer that may include $Si_3N_4$) formed over the oxide layer. In some examples, the hard mask layer 204 includes thermally grown oxide, CVD-deposited oxide, and/or ALD-deposited oxide. In some embodiments, the hard mask layer 204 includes a nitride layer deposited by CVD or other suitable technique. The hard mask layer 204 may be used to protect portions of the substrate 202 and/or used to define a pattern (e.g., fin elements) illustrated below. By way of example, the oxide layer of the hard mask layer 204 may have a thickness of between approximately 5 nanometers (nm) and approximately 40 nm. In some embodiments, the nitride layer of the hard mask layer 204 may have a thickness of between approximately 20 nm and approximately 160 nm.

In an embodiment, the method 100 includes at block 102 performing an anti-punch through (APT) implant(s) and/or other fabrication processes to provide a suitable substrate for transistor formation.

The method 100 then proceeds to block 104 where fin elements, used for subsequent FinFET formation, are formed on the substrate. With reference to the example of FIG. 3, in an embodiment of block 104, a plurality of fin elements 302 extending from the substrate 202 are formed. The fin elements 302 may define the "active" regions of the substrate where the transistor(s) will be formed.

The fins 302, as described with reference to the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 302 may be fabricated using suitable processes including photolithography and etch processes. The photolithography process may include forming a photoresist layer over the substrate 202 (e.g., over the hard mask layer 204), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches in unprotected regions through the patterned hard mask layer 204 and into the substrate 202, thereby leaving the plurality of extending fins 302. The trenches between fins 302 may be etched using a dry etch (e.g., reactive ion etching), a wet etch, and/or other suitable processes. Numerous other embodiments of methods to form the fins on the substrate may also be used.

The method 100 then proceeds to block 106 where isolation features are formed between the fin elements. The isolation features may be shallow trench isolation (STI) features. With reference to the example of FIG. 4, STI features 402 are disposed between the fins 302. By way of example, in some embodiments, a dielectric layer is first deposited over the substrate 202, filling the trenches interposing the fins 302 with the dielectric material. In some embodiments, the dielectric layer may include $SiO_2$, silicon nitride, silicon oxynitride, fluorine-doped silicate glass (FSG), a low-k dielectric, combinations thereof, and/or other suitable materials known in the art. In various examples, the dielectric layer may be deposited by a chemical vapor deposition (CVD) process, a subatmospheric CVD (SACVD) process, a flowable CVD process, an atomic layer deposition (ALD) process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 402) may include a multi-layer structure, for example, having one or more liner layers.

Figure 4:
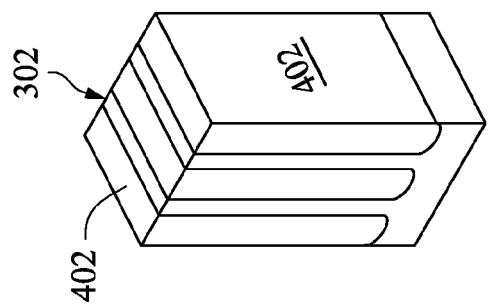

In forming the STI features, after deposition of the dielectric layer(s), the deposited dielectric material thinned and planarized, for example by a chemical mechanical polishing (CMP) process. The CMP process may planarize the top surface thereby forming STI features 402 as illustrated in FIG. 4. As illustrated in FIG. 4, in some embodiments, the CMP process used to planarize the top surface of the device 200 and form the STI features 402 may also serve to remove the hard mask layer 204 from each of the plurality of fin elements 302. In some embodiments, removal of the hard mask layer 204 may alternately be performed by using a suitable etching process (e.g., dry or wet etching).

Figure 5B:
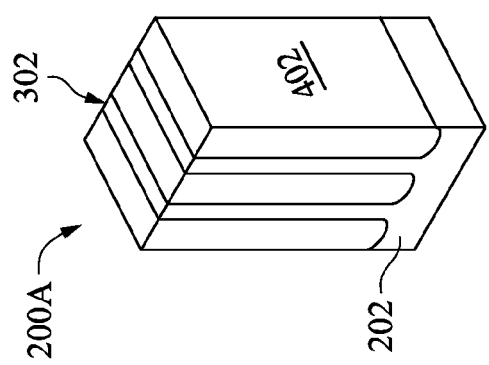

The method 100 then proceeds to block 108 where respective NFET and PFET features are defined. In an embodiment, the device 200A illustrated in FIG. 5A is defined as an NFET device and the device 200B illustrated in FIG. 5B is a PFET device. The devices 200A and 200B may be formed on a single substrate 202.

In an embodiment, the fin 302 in the device 200A is silicon. The fin 302 of the device 200A may be suitably doped and/or be undoped depending on the desired device performance.

In an embodiment of the method 100, a channel region of the device 200B (e.g., PFET device) is modified to improve mobility. For example, an epitaxial fin portion 502 may be formed for the device 200B. In an embodiment, the epitaxial fin portion 502 is silicon germanium (SiGe). Alternatively, in some embodiments, the epitaxial fin portion 502 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In an example of suitable fabrication methods, the fin 302 in the device 200B (FIG. 4) is recessed and the epitaxial fin portion 502 is grown in recess. The epitaxial fin portion 502 may be formed using a molecular beam epitaxy (MBE) process, a metalorganic chemical vapor deposition (MOCVD) process, and/or other suitable epitaxial growth processes. During the removal and epitaxial growth process the device 200A may be protected. The epitaxial growth process may be followed by suitable planarization processes such as CMP. The epitaxial fin portion 502 may undoped or may be suitably doped to provide for desired device performance.

Thus, in an embodiment, the fin 302 of the device 200A includes a first semiconductor material (substrate 202) and the fin 302 of the device 200B has the first semiconductor material portion (substrate 202) and a second semiconductor material, different than the first, portion (502). For example, in an embodiment, the fin 302 of the device 200A includes silicon (substrate 202) and the fin 302 of the device 200B has a silicon portion (substrate 202) and a silicon germanium portion (502).

By way of example, the fins 302 (including the epitaxial fin portion 502) may be suitably doped to include arsenic, phosphorous, antimony, or other N-type donor material or to include boron, aluminum, gallium, indium, or other P-type acceptor material depending on the desired device performance.

Figure 6A:
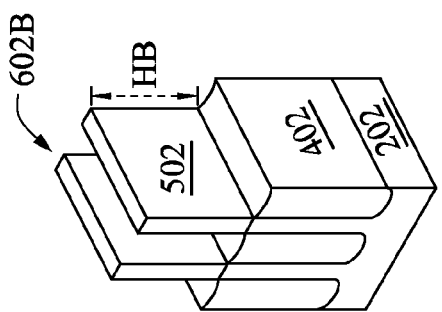
Figure 6B:
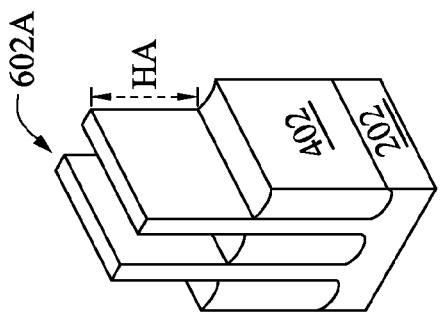
Figure 8B:
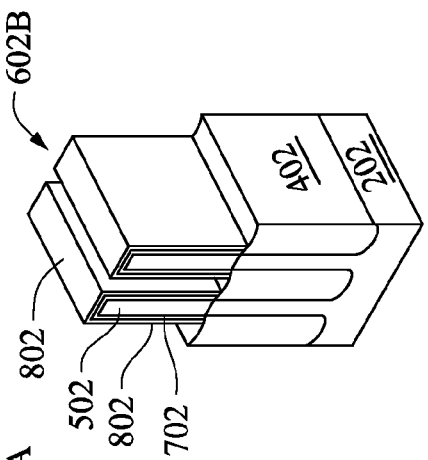
Figure 8A:
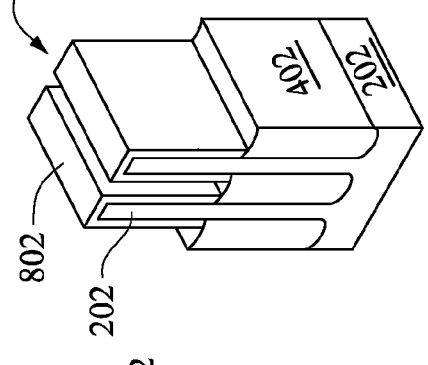
Figure 7B:
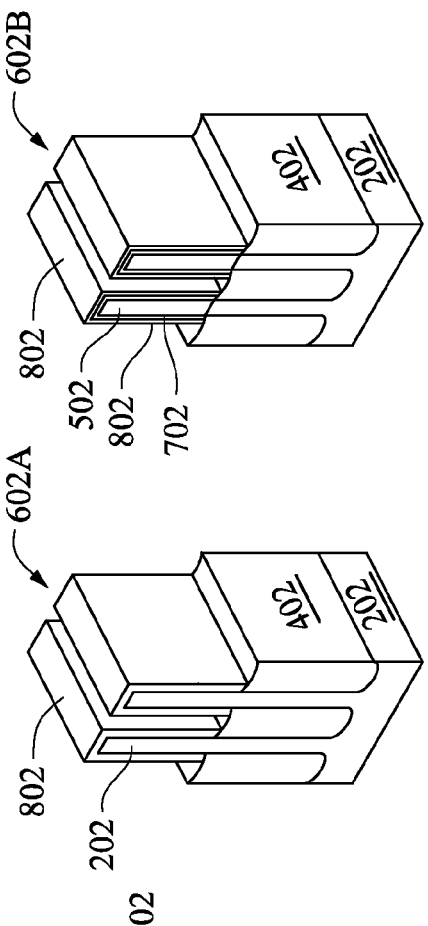
Figure 7A:
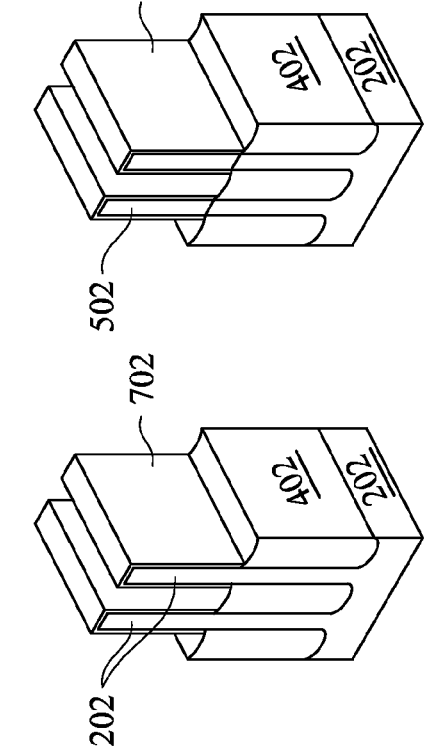

The method 100 then proceeds to block 110 where the STI features are recessed to expose the fin. Referring to the example of FIGS. 6A and 6B, the STI features 402 have been recessed providing fins 602A and 602B respectively, extending above a top surface of the STI features 402. In some embodiments, the recessing process may include a dry etching process, a wet etching process, and/or a combination thereof. In some embodiments, a recessing depth is controlled (e.g., by controlling an etching time) so as to result in a desired height, HA and HB respectively, of the exposed upper portion of the fin elements 602A and 602B. In an embodiment, the height HA is between approximately 30 nanometers (nm) and approximately 60 nm. In an embodiment, the height HB is between approximately 30 nanometers (nm) and approximately 60 nm. HA may be substantially equal to HB. While FIG. 6B illustrates the recess of the STI feature 402 being substantially coplanar with a bottom surface of the epitaxial fin portion 502, in other embodiments this may not be required.

In an embodiment, the method 100 then proceeds to block 112 where one or more sacrificial layers are formed on the substrate. In an embodiment, a capping layer and/or dummy dielectric (e.g., oxide) layer are formed on the substrate. Referring to the example of FIGS. 7A and 7B, a capping layer 702 is formed on the fins 602A and 602B. In an embodiment, the capping layer 702 is silicon. The capping layer 702 may provide protection for the epitaxial fin portion 502 during subsequent processing and/or allow for similar gate stack composition during subsequent processing of the finds 602A and 602B. The capping layer 702 may be formed by epitaxial growth, ALD, CVD or other suitable deposition technique. In an embodiment, the capping layer 702 is between about 1 and 2 nanometers in thickness.

After the deposition of the silicon capping layer, the layer may be removed from the NFET device region. Using the example of FIG. 8A, the silicon capping layer 702 is removed from device 200A (e.g., NFET). The capping layer 702 may be removed from the device 200A using suitable etching processes, while device 200B and the capping layer 702, is protected.

The method 100 at block 112 may further include forming a dummy insulating layer. The dummy insulating layer may also be referred to as a dummy oxide layer; however, the constraint to an oxide composition is not particularly required. In an embodiment, the dummy insulating layer also forms an I/O oxide. The dummy oxide layer may be formed by atomic layer deposition (ALD) and/or other suitable processes. Referring to the example of FIGS. 8A and 8B, a dummy oxide 802 is disposed on the fins 602A and/or 602B. (It is noted that the dummy oxide 802 may also be formed on the surface of the STI features 402). In some embodiments, the dummy oxide 802 may include $SiO_2$. However, in other embodiments, a dummy dielectric having other compositions is possible, including, for example, silicon nitride, a high-K dielectric material or other suitable material. In various examples, the dummy oxide 802 may be deposited by a CVD process, a subatmospheric CVD (SACVD) process, a flowable CVD process, an ALD process, a PVD process, or other suitable process. By way of example, the dielectric layer 802 may be used to prevent damage to the fin elements by subsequent processing (e.g., subsequent formation of the dummy gate stack).

The method 100 then proceeds to block 114 where a dummy (also referred to as sacrificial) gate structure is formed on the fin elements. The dummy gate structure may be subsequently removed and replaced with a functional gate as discussed below, referred to as a replacement gate process. While the present disclosure includes examples of this replacement gate method, one can recognize other embodiments were a replacement gate process is not employed and a functional gate is formed in block 114. In an embodiment, the gate structure formed in block 114 includes a polysilicon gate electrode.

Figure 9B:
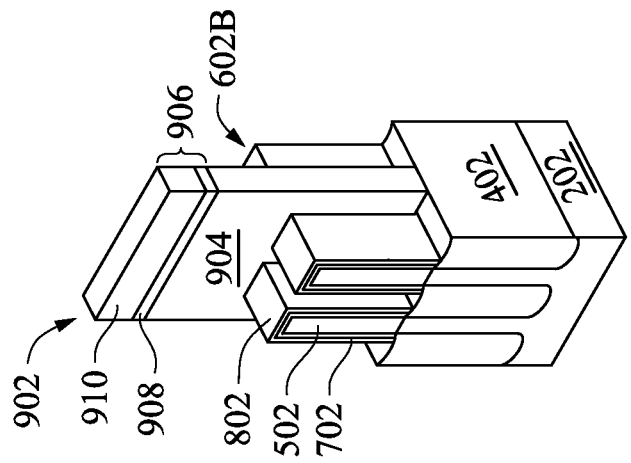
Figure 9A:
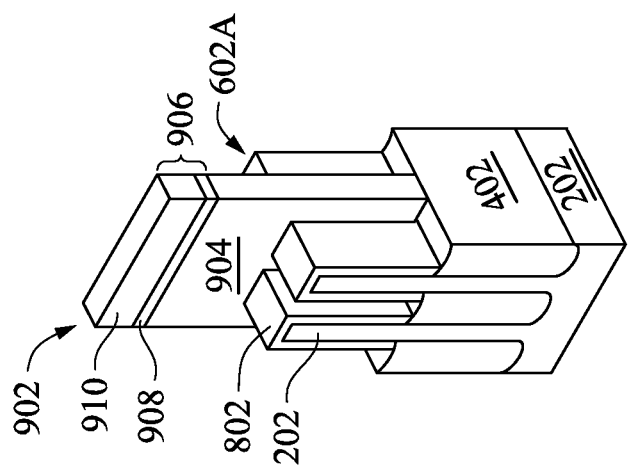
Figure 10B:
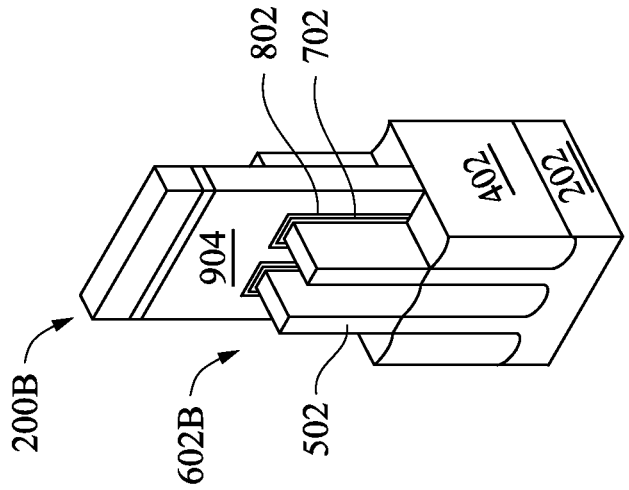
Figure 10A:
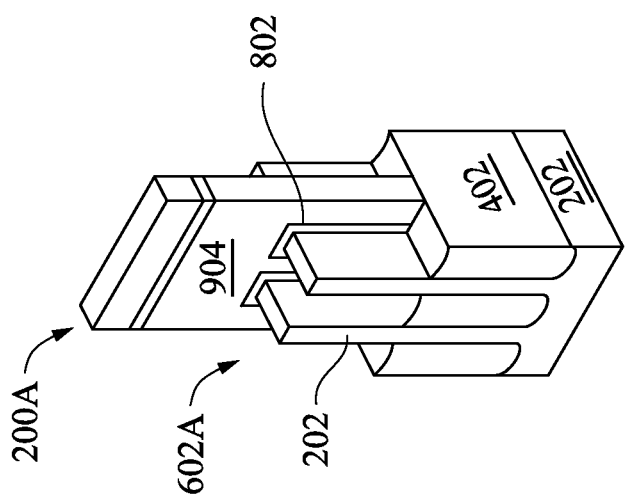
Figure 11B:
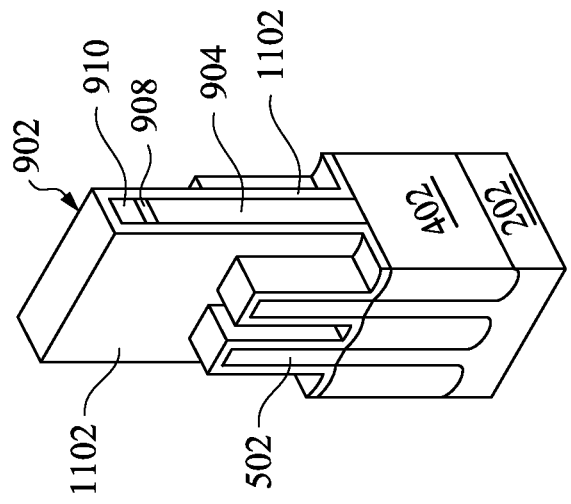
Figure 11A:
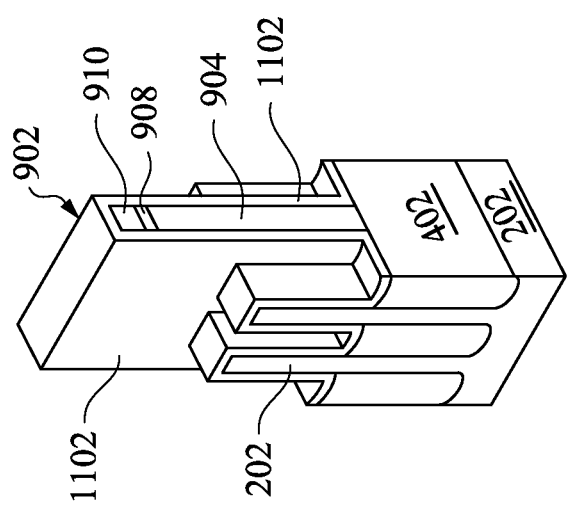
Figure 12A:
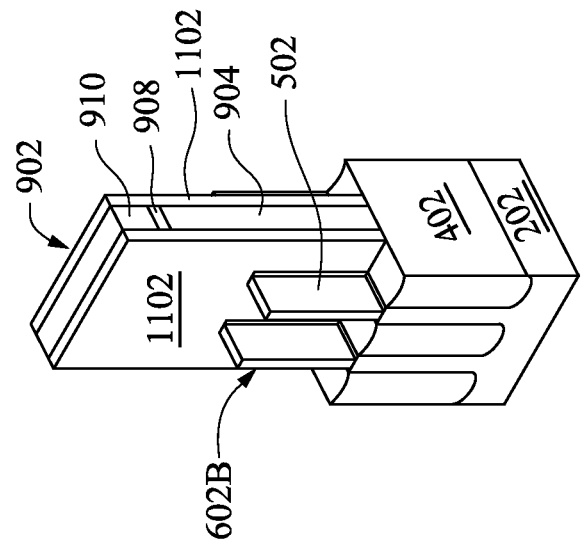
Figure 12B:
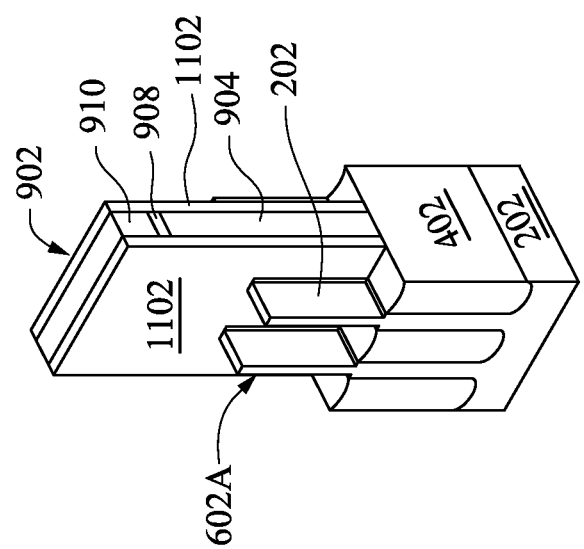

Using the example of FIGS. 9A and 9B, a gate stack 902 is formed. In an embodiment, the gate stack 902 is a dummy (sacrificial) gate stack that is subsequently removed as discussed below. (However, as referenced above, in some embodiments of the method 100, the gate stack 902 or portions thereof may be maintained.) The gate stack 902 is formed over the substrate 202 and is at least partially disposed over the fin elements 602A and 602B respectively. The portion of the fin elements 602A and 602B directly underlying the gate stack 902 may be referred to as the channel region. The gate stack 902 may also define a source/drain region of the fin elements 602A and 602B, for example, the regions of the respective fin elements 602A and 602B adjacent and on opposing sides of the channel region of the fin elements 602A and 602B.

In some embodiments, the dummy gate stack 902 includes the dielectric layer 802, an electrode layer 904, and a hard mask layer 906 which may include multiple layers 908 and 910 (e.g., an oxide layer 908 and a nitride layer 910). The gate stack 902 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the electrode layer 904 of the gate stack 902 may include polycrystalline silicon (polysilicon). In some embodiments, the hard mask layer 906 includes an oxide layer 908 such as a pad oxide layer that may include $SiO_2$. In some embodiments, hard mask layer 906 includes the nitride layer 910 such as a pad nitride layer that may include $Si_3N_4$, silicon oxynitride or alternatively include silicon carbide.

The method 100 then proceeds to block 116 where the dummy oxide layer is removed from the source/drain regions of the fin elements. The dummy oxide layer may be removed by a suitable selective etching process such as a dry etching CERTAS® Gas Chemical Etch System by Tokyo Electron Limited, or other suitable etching process. Referring to the example of FIGS. 10A and 10B, the dummy oxide 802 has been removed from the source/drain regions of the fin elements 602A and 602B.

In an embodiment, block 116 of the method 100 may also include removing the capping layer 702 from the device 200B and in particular in the exposed source/drain regions of the fin elements 602B. The capping layer 702 may be removed by suitable etching processes. In some embodiments, while removing the capping layer 702 from the device 200B a layer of the fin 602A (e.g., capping layer 702 of exposed layer 202 maybe simultaneously removed.

The method 100 then proceeds to block 118 where spacer elements are formed on the substrate including the sidewalls of the dummy gate structure. The spacer layer may be a conformal dielectric layer formed on the substrate. The spacer layer may form spacer elements on the sidewalls of the gate structure. The spacer layer may include a dielectric material such as silicon oxide, silicon nitride, silicon carbide, silicon oxynitride, SiCN films, silicon oxycarbide, SiOCN films, and/or combinations thereof. In some embodiments, the spacer layer includes multiple layers, such as main spacer walls, liner layers, and the like. By way of example, the spacer layer may be formed by depositing a dielectric material using processes such as, CVD process, a subatmospheric CVD (SACVD) process, a flowable CVD process, an ALD process, a PVD process, or other suitable process. Referring to the example of FIGS. 11A and 11B, a spacer layer 1102 is disposed on the substrate 202.

After deposition of the dielectric material, block 118 may continue to be followed by an etching back of the dielectric material. Referring to the example of FIGS. 12A and 12B, the spacer material layer has been etched back to expose the source/drain regions of the fins. The spacer material layer 1102 remains on the sidewalls of the gate structure 902.

In some embodiments, the method 100 proceeds to block 120 where the fin elements are trimmed (e.g., decreased in width). Referring to the example of FIGS. 12A and 12B, the exposed fins 602A and 602B are trimmed such that their width is decreased. In an embodiment, approximately 1 nm to approximately 12 nm of width of the fin is removed from the exposed fins. In a further embodiment, approximately 2 nm of width of the fins 602A and/or 602B are trimmed (e.g., removed). In an embodiment of the method 100, block 120 is omitted and the fins are not trimmed. In some embodiments, the fins 602A and 602B may be trimmed a different amount. In some embodiments, either one of 602A or 602B are trimmed, while the other of fins 602A or 602B is not.

In an embodiment, the trimming process includes exposing the fins 602A and 602B to an ozone environment such that a portion of the fins 602A/602B (e.g., silicon, silicon germanium) is oxidized. The oxidized portion is then removed through a cleaning or etching process such as discussed above with reference to block 116 of the method 100. Additional example etchants used for the trimming process may include a mixture of sulfuric acid ($H_2SO_4$) and hydrogen peroxide ($H_2O_2$) (known as a sulfuric peroxide mixture (SPM)), a mixture of ammonium hydroxide ($NH_4OH$), $H_2O_2$, and water ($H_2O$) (known as an ammonia-peroxide mixture (APM)), a mixture of $NH_4OH$ and $H_2O_2$, $H_2O_2$, and/or other etchants as known in the art. Alternatively, in some embodiments, the trimming process may include a dry etching process or a combination of a dry/wet etching process.

As described in further detail with reference to FIGS. 15A, 15B, and 15C, the width of the fin below the top of the STI feature is not exposed and thus, not trimmed. Similarly, in some embodiments, the fin 602A and 602B are not trimmed in the channel region, which underlie the gate structure 902.

The method 100 then proceeds to block 122 where an epitaxial growth process forms source/drain features on the fin elements. The source/drain features may be formed by performing an epitaxial growth process that provides an epitaxy material cladding the fin element's source/drain regions. The epitaxial regions of the NFET and PFET devices may be grown in different processes or the same processes and/or include different materials and/or dopants or dopant profiles.

Figures 13A, 13B:
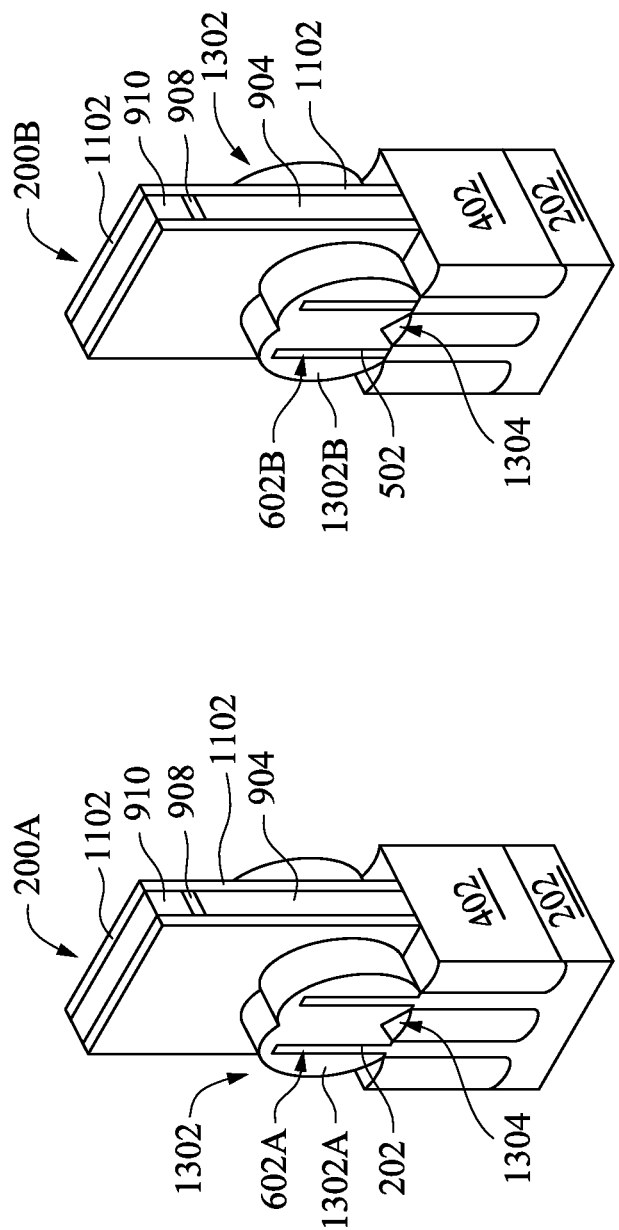

Referring to the example of FIGS. 13A and 13B, source/drain features 1302 are formed on the substrate 202 on the fin 602A and 602B adjacent to the gate stack 902. For example, the source/drain features 1302 for the device 200A include material 1302A formed by epitaxially growing a semiconductor material on the exposed fin 602A. In other words, the material 1302A is formed around the exposed fin 602A adjacent the gate 902; this may be referred to as forming a "cladding." Additionally, the source/drain features 1302 for the device 200B include material 1302B formed by epitaxially growing a semiconductor material on the exposed fin 602B. In other words, the material 1302B is formed around or "cladding" the exposed fin 602B.

In various embodiments, the grown semiconductor material 1302A and/or 1302B may include Ge, Si, GaAs, AlGaAs, SiGe, GaAsP, SiP, or other suitable material. In some embodiments, the material 1302A/1302B may be in-situ doped during the epitaxial process. In some embodiments, the epitaxially grown material 1302A/132B is not in-situ doped, and, for example, instead an implantation process is performed to dope the epitaxially grown material 1302A and 1302B.

In an embodiment, the fin element 602A is silicon and the epitaxially grown material 1302A also is silicon. In some embodiments, the fins 602A and 1302A may comprise a similar material, but be differently doped. In other embodiments, the fins 602A includes a first semiconductor material, the epitaxially grown material 1302A includes a second semiconductor different than the first semiconductor material. In an embodiment, epitaxially grown material 1302A is silicon being doped with phosphorous. In a further embodiment, the phosphorous dopant concentration may be between approximately $5 \times 10^{20}$ and approximately $2 \times 10^{21}$ atoms per $cm^3$. The epitaxially grown material 1302A may be alternatively suitably doped to include arsenic, antimony, or other N-type donor material.

In some embodiments, the fins 602B and 1302B may comprise a similar material, but be differently doped and/or include a different percentage of a component. In some embodiments, the fins 602B includes a first semiconductor material, the epitaxially grown material 1302B includes a second semiconductor different than the first semiconductor material. In an embodiment, the fin element 602B is silicon germanium and the epitaxially grown material 1302B also is silicon germanium. In a further embodiment, the epitaxially grown material 1302B may be $Si_{1-x}Ge_x$ with a germanium percent composition of between approximately 50% and 100% (i.e., x is between 0.5 and 1 (e.g., including substantially Ge, without Si)). In an embodiment, the fin portion 502 is silicon germanium having a germanium percent composition between approximately 20 and approximately 50 percent. The epitaxially grown material 1302B may be SiGe suitably doped with a P-type dopant material such as boron. For example, the boron dopant concentration may be between approximately $5 \times 10^{20}$ and approximately $2 \times 10^{21}$ atoms per $cm^3$. Thus, in an embodiment, the epitaxially grown material 1302B is SiGe with between 50% and 100% germanium composition (e.g., including Ge with substantial no Si), the fin portion 502 is SiGe with between approximately 20 and 50% germanium composition, the epitaxially grown material 1302B has a dopant concentration (e.g., boron) of between approximately $5 \times 10^{20}$ and approximately $2 \times 10^{21}$ atoms per $cm^3$.

Upon completion of the growth process, the epitaxially grown material (1302A, 1302B) may have a curvilinear surface. A curvilinear surface is illustrated by the sidewalls of the epitaxial grown material 1302A, 1302B in FIGS. 13A and 13B. The curvilinear surface may be formed by using a plurality of epitaxial growth processes to form each of the elements 1302A, 1302B, where each deposition is followed by an etching process. In an exemplary process, an etchant precursor (e.g., HCl) is provided in a epitaxialy growth tool to provide the etch process in-situ with the epitaxial growth. An epitaxial grown feature with a curvilinear surface may also be referred to as "facet-free," as discussed above. The dimensions and shape of the epitaxial grown material is discussed in further detail below with reference to FIGS. 15a, 15b, 15c and 15d.

The formation of the source/drain features 1302 also provide for formation of a gap 1304. The gap 1304 may be filled with air and thus, referred to as an "air-gap." The air-gap 1304 has a substantially triangular-shape in the cross-section defined by the curvilinear edges of the respective epitaxial features 1304A/1304B and a top surface of the STI feature 402. The air-gap 1304 is discussed in further detail below. The air-gap 1304 may provide advantages to the devices such as reduction of source/drain to gate parasitic capacitance and/or improvement to device speed and/or improvement to device power performance.

The method 100 then proceeds to block 124 where an inter-layer dielectric (ILD) layer is formed on the substrate. Referring to FIGS. 14A and 14B, in an embodiment of block 124, an ILD layer 1402 is formed over the substrate 202. In some embodiments, a contact etch stop layer (CESL) is also formed over the substrate 202 prior to forming the ILD layer 1402. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. Exemplary materials of the ILD layer 1402 include, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1402 may be deposited by a PECVD process or other suitable deposition technique. In some embodiments, after formation of the ILD layer 1402, the semiconductor device 200 may be subject to a high thermal budget process to anneal the ILD layer. The ILD layer may include a plurality of layers.

In some examples, after depositing the ILD layer, a planarization process (e.g., CMP) may be performed to expose a top surface of the dummy gate stack. Using FIGS. 14A and 14B as exemplary, a planarization process removes portions of the ILD layer 1402 (and CESL layer, if present)

overlying the gate stack 902 and planarizes a top surface of the semiconductor device 200A, 200B. In addition, the planarization process may remove the hard mask 906 overlying the gate stack 902 to expose the electrode layer 904.

The method 100 then proceeds to block 126 where a replacement gate is formed. Block 126 of the method 100 includes removing the dummy gate structure or portion thereof. As one example, the previously formed dummy gate structure 902 (e.g., the dielectric layer 802 and the electrode layer 904) is removed from the substrate. It is noted that the capping layer 702 may also be removed from the fin 602B in the device 200B. The removal of the dielectric layer 802 and the electrode layer 904 of the gate structure 902 results in an opening or trench. A final gate structure (e.g., including a high-K dielectric layer and metal gate electrode) may be subsequently formed in the trench or opening, as described below. The removal of the dummy gate stack features may be performed using a selective etch process, such as a selective wet etch, a selective dry etch, or a combination thereof.

In some embodiments, block 126 continues to include forming of a replacement functional gate structure including a high-K/metal gate stack. Referring to the example of FIGS. 15A and 15B, a gate structure 1502 is formed within the opening provided by the removal of the dummy gate structure 902. In various embodiments, the gate structure 1502 includes a high-K gate dielectric layer and a metal gate electrode stack. The gate structure 1502 may also include an interfacial layer formed over the channel region of the fin, a high-K gate dielectric layer formed over the interfacial layer, and a metal layer formed over the high-K gate dielectric layer. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack includes depositions to form various gate materials and one or more CMP processes to remove excessive gate materials and thereby planarize a top surface of the semiconductor devices 200A and 200B respectively.

In some embodiments, the interfacial layer of the gate stack 1502 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer of the gate structure 1502 may include a high-K dielectric layer such as hafnium oxide ($HfO_2$). Alternatively, the gate dielectric layer of the gate stack 1502 may include other dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer may be formed by ALD, physical vapor deposition (PVD), CVD, oxidation, and/or other suitable methods. The metal layer of the gate structure 1502 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the gate structure 1502 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer may provide an N-type or P-type work function, may serve as a transistor (e.g., FinFET) gate electrode, and in at least some embodiments, the metal layer of the gate structure 1502 may include a polysilicon layer. In various embodiments, the metal layer of the gate structure 1502 may be formed by ALD, PVD, CVD, e-beam evaporation, or other suitable process. Further, the metal layer of the gate structure 1502 may be formed separately for N-FET and P-FET transistors which may use different metal layers. In various embodiments, a CMP process may be performed to remove excessive metal from the metal layer of the gate structure 1502, and thereby provide a substantially planar top surface of the metal layer of the gate structure 1502.

Figure 15A:
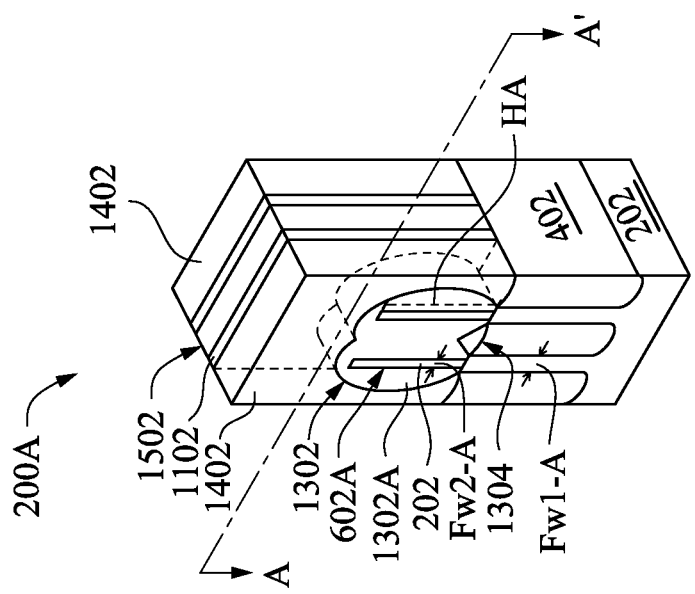

Referring now to FIGS. 15C and 15D, illustrated are the cross-sectional views of the device 200A and 200B, respectively along a plane cut as indicated in AA' of FIGS. 15A and 15B, respectively. In particular, FIGS. 15C and 15D illustrate the cross-section of the source/drain region of the devices 200A and 200B respectively. Again, in an embodiment, the device 200A is an NFET device. In an embodiment, the device 200B is a PFET device.

The following discussion presents exemplary dimensions for various elements of the features of the devices 200A and 200B. These dimensions are exemplary only and not intended to be limiting beyond what is specifically recited in the claims that follow. With reference to FIG. 15C, in an embodiment, the fin width $Fw1\_A$ is between approximately 6 nm and approximately 14 nm. These dimensions may be determined by the lithography and patterning steps used to define the fin elements as discussed above with reference to block 104 of the method 100. In an embodiment, $Fw1\_LA$ is also the width of the fin in the channel region underlying gate structure 1502. In an embodiment, the upper fin width $Fw2\_A$ is between approximately 2 nm and approximately 6 nm. The fin width $Fw2\_A$ is determined by the trim process described above with reference to block 120 applied to the fin elements defined as discussed above with reference to block 104 of the method 100. A width $Fw2\_A$ less than the width $Fw1\_A$ may be provide, for example, for a benefit of allowing for ease of epitaxial growth between fin elements 602A. The distance between fins 602A/B or width of the STI features 402 is SA, which in an embodiment may be between approximately 10 nm and 20 nm. In a further embodiment, SA is approximately 16 nm. The fin element 602A has a height HA above a top surface of the STI feature 402; in an embodiment, HA is between approximately 30 nm and approximately 60 nm.

The air-gap 1304 may be approximately triangular in cross-section with a height HgapA and a bottom side defined by the STI feature 402 having a length SA. In an embodiment, HgapA is between approximately 10 nm and approximately 15 nm. Therefore, the HgapA may be between approximately 10% and approximately 40% of the height of the exposed fin HA.

With reference to FIG. 15D, in an embodiment of the device 200B, the fin width $Fw1\_B$ is between approximately 6 nm and approximately 14 nm. In an embodiment, the fin width $Fw1\_B$ is also the width of the fin 602B in the channel region. This dimension may be determined by the lithography and patterning steps used to define the fin elements as discussed above with reference to block 104 of the method 100. In an embodiment, the upper fin width $Fw2\_B$ is between approximately 2 nm and approximately 6 nm. The fin width $Fw2\_B$ is determined by the trim process described above with reference to block 120 applied to the fin elements defined as discussed above with reference to block 104 of the method 100. A width Fw2_B less than the width Fw1_B may be provide, for example, for a benefit of allowing for ease of epitaxial growth between fin elements 602A. The width of the STI features 402 is SB, which in an embodiment may be between approximately 10 nm and 20 nm. In a further embodiment, SB is approximately 16 nm. The fin element 602 has a height HB above a top surface of the STI feature 402; in an embodiment, HB is between approximately 30 nm and approximately 60 nm.

The air-gap 1304 may be approximately triangular in cross-section with a height HgapB and a bottom side defined by the STI feature 402 having a length SB. In an embodiment, HgapB is between approximately 10 nm and approximately 15 nm. Therefore, the HgapB may be between approximately 10% and approximately 40% of the height of the exposed fin HB.

The respective dimensions of the semiconductor devices 200A and 200B may be substantially similar to one another, or have different values. For example, in some embodiments, Fw2_A may be substantially similar to Fw2_B; in some embodiments, Fw2_A may be vary from Fw2_B. As another example due to the fin width and/or epitaxy material differences, in some embodiments, HgapA may be substantially similar to HgapB; in some embodiments, HgapA may be vary from HgapB.

The semiconductor devices 200A and 200B may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

It is also noted that the exemplary figures illustrate two fins for each of device 200A and 200B, however any number of fins is possible and any number of fins may be associated with a given gate structure.

In another exemplary embodiment of the method 100 of FIG. 1, the method omits providing a different fin element composition for one of the device types (e.g., PFET). In other words, block 108 does not include the removal of the patterned fin in one device region and the growth of epitaxial material in its place as illustrated by FIGS. 5A and 5B and the fin portion 502. In such embodiments, the substrate 202 continues to form the fins 602A and 602B of the devices 200A and 200B respectively. This is illustrated by devices 1600A and 1600B provided in isometric view in FIGS. 16A, 16B.

In an embodiment, the device 1600A is a NFET device. The device 1600A may be substantially similar to the device 200A described above. Similar elements are denoted with the same reference numbers for ease of understanding.

In an embodiment, the device 1600B is a PFET device. The device 1600B may be substantially similar to device 200B, described above, except that the fin element 1602B is formed of substrate 202 (omitting fabrication of fin portion 502). Thus, in an embodiment, the fin element 1602B is silicon. In some embodiments, the fin element 1602B is suitably doped; in other embodiments, the fin element is un-doped. The fin element 1602B may be silicon. The epitaxial material 1302B may be silicon germanium suitably doped with a P-type dopant material such as boron. In an embodiment, the fin element is silicon and the epitaxially grown material 1302B is silicon germanium having a germanium percent composition of between approximately 50 and approximately 100%; the epitaxially grown material 1302B may be suitably doped for example, having a boron dopant concentration of between approximately $5 \times 10^{20}$ and approximately $2 \times 10^{21}$ atoms per $cm^3$.

Figures 16A, 16B:
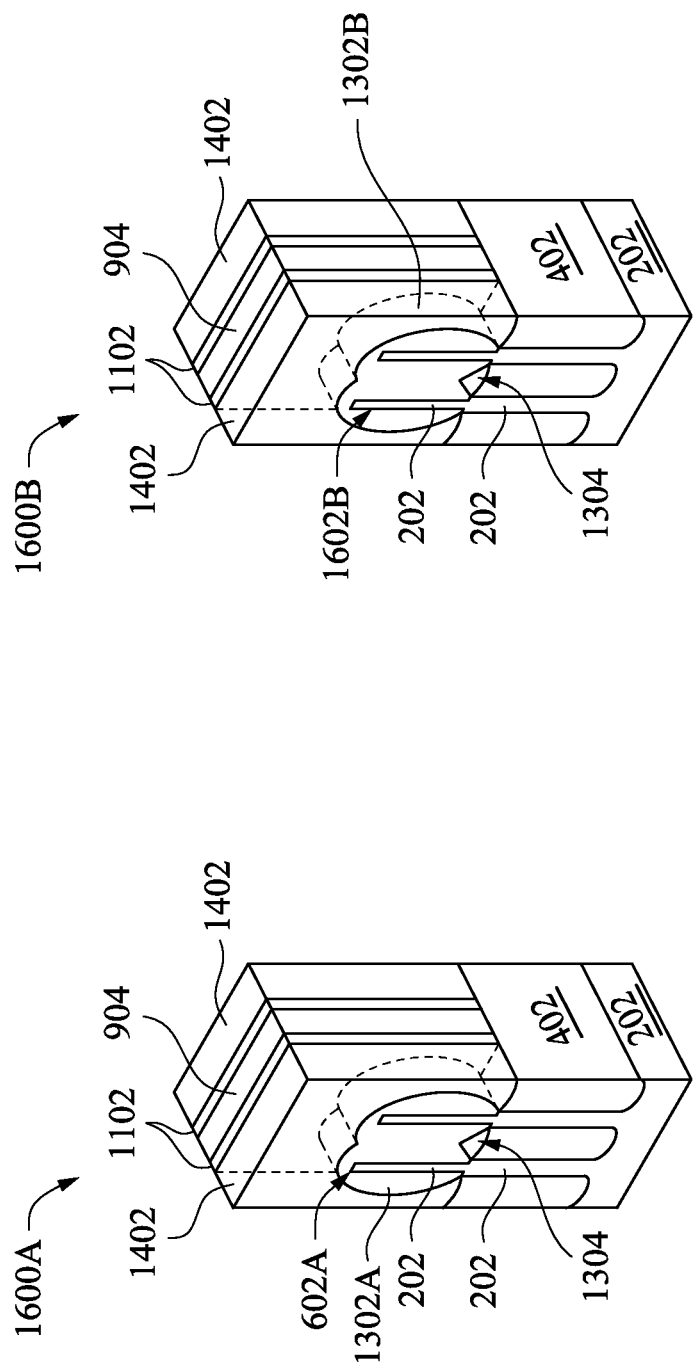
FIGS. 16A and 16B are isometric views of an embodiment of a device 1600 according to aspects of another exemplary embodiment of the method of FIG. 1.
Figure 16C:
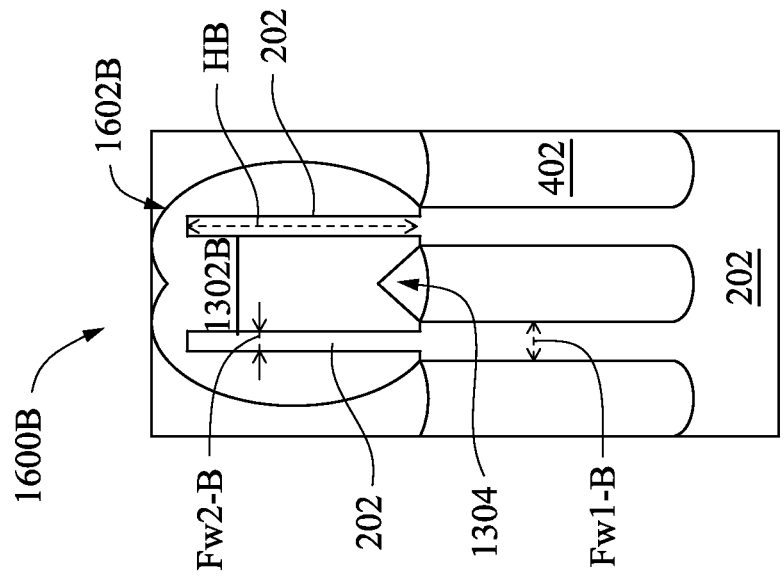
FIGS. 16C and 16D are corresponding cross-sectional views.
Figure 16D:
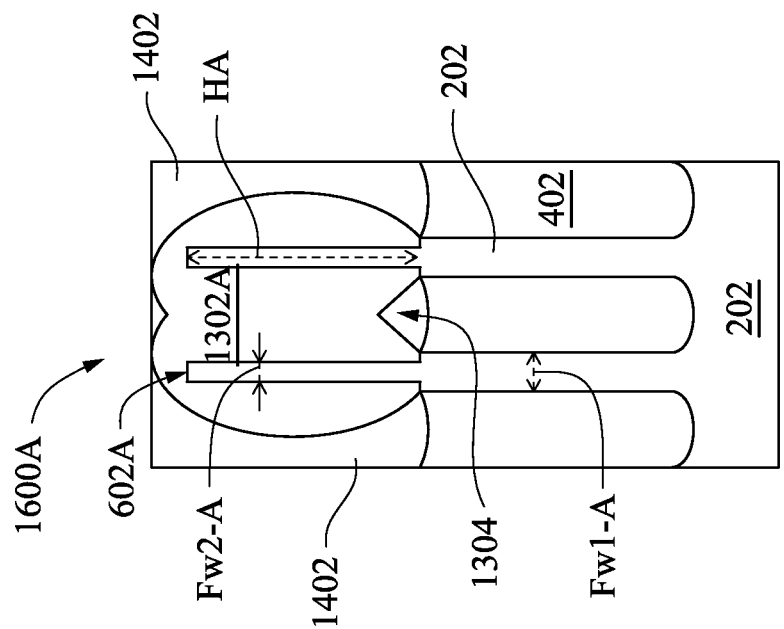

Referring now to FIGS. 16C and 16D, illustrated are the cross-sectional views of the device 1600A and 1600B, respectively along a plane cut as indicated in AA' of FIGS. 16A and 16B, respectively. In particular, FIGS. 16C and 16D illustrate the cross-section of the source/drain region of the devices 1600A and 1600B respectively. Again, in an embodiment, the device 1600A is an NFET device. In an embodiment, the device 1600B is a PFET device. FIGS. 16C and 16D are substantially similar to FIGS. 15C and 15D discussed above with the omission of the region 502. As above, the recited dimensions are exemplary only and not intended to be limiting beyond what is specifically recited in the claims that follow.

Also as discussed above, the semiconductor devices 1600A and 1600B may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

It is also noted that the exemplary figures illustrate two fins for each of device 1600A and 1600B, however any number of fins is possible and any number of fins may be associated with a given gate structure.

Figure 17:
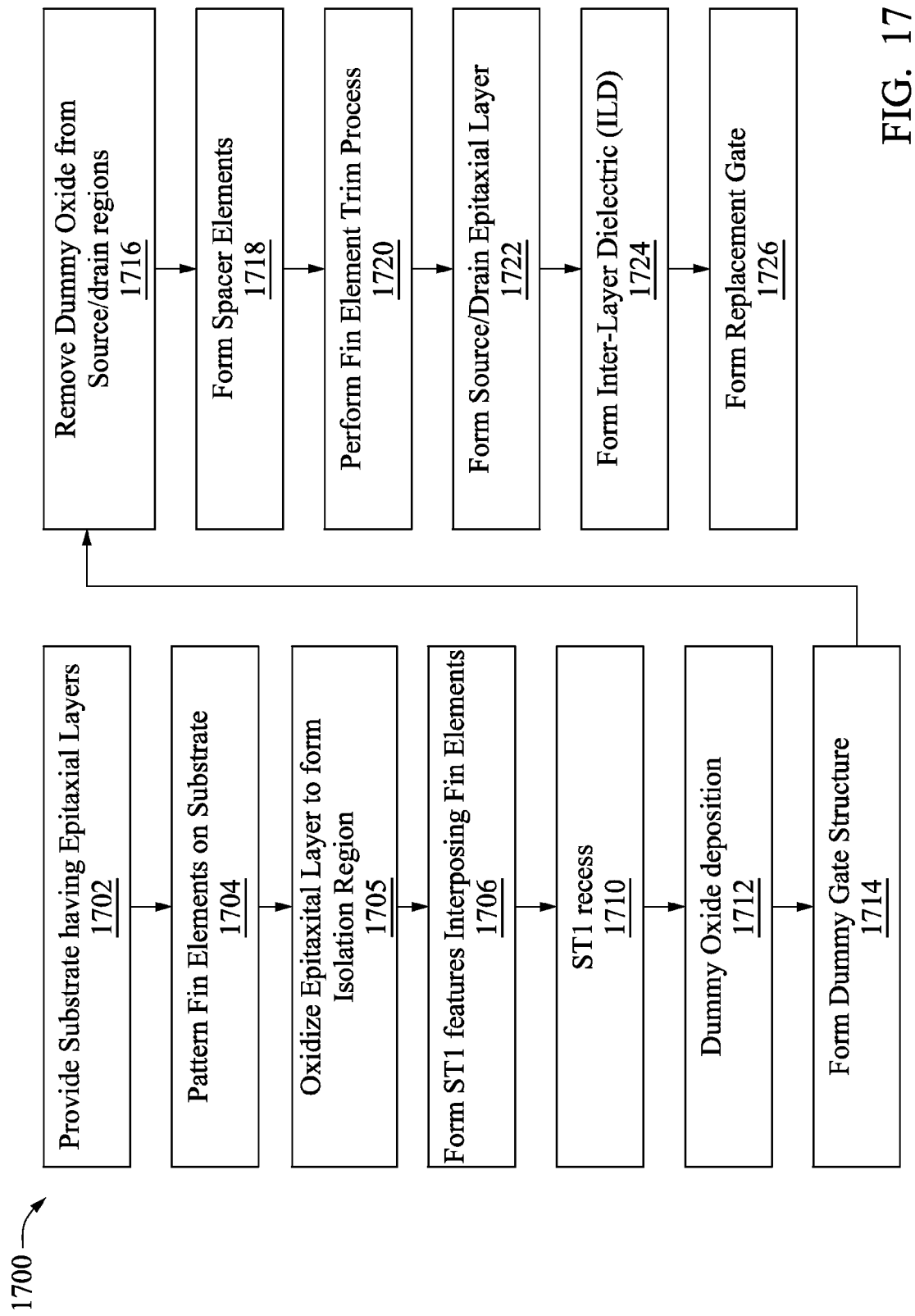
FIG. 17 is a flow chart of another method of fabricating a FinFET device or portion thereof according to one or more aspects of the present disclosure.

Referring now to FIG. 17, illustrated is a method 1700 of semiconductor fabrication including fabricating a FinFET device having an epitaxy source/drain feature. The method 1700 includes forming a FinFET device having a channel on oxide scheme to provide for device enhancement including, for example, possible improvement in mobility and/or an improved fin profile (e.g., straight edges).

Figure 31:
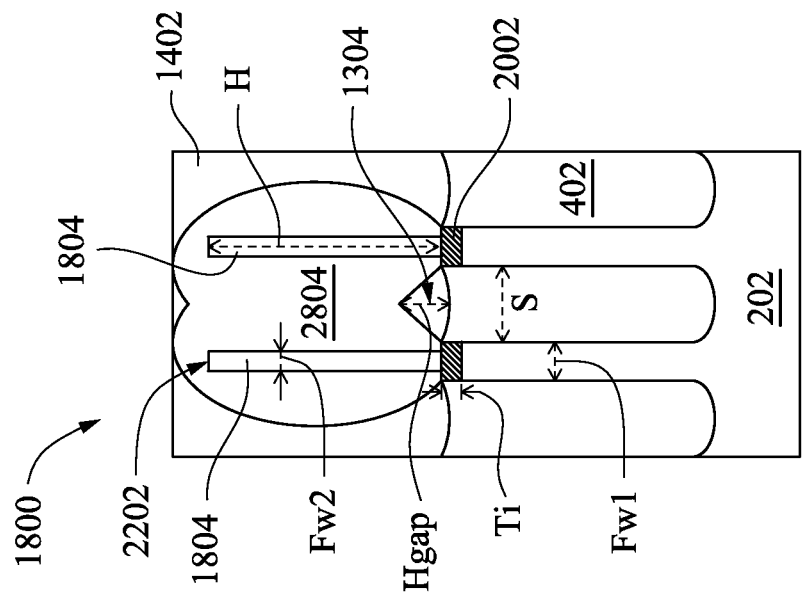
FIG. 31 is a cross-sectional view, corresponding to the isometric view of FIG. 30, of an embodiment of the device 1800 according to aspects of the method of FIG. 17.

It is understood that the method 1700 includes steps having features of a complementary metal-oxide-semiconductor (CMOS) technology process flow and thus, are only described briefly herein. Additional steps may be performed before, after, and/or during the method 1700. FIGS. 18-30 are isometric views of an embodiment of a semiconductor device 1800 according to various stages of the method 1700 of FIG. 17. FIG. 31 is a cross-sectional view, corresponding to respective isometric view of FIG. 30. It is understood that parts of the semiconductor device 1800 may be fabricated by a CMOS technology process flow, and thus some processes are only briefly described herein. Further, the semiconductor device 1800 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 1700, including any descriptions given with reference to FIGS. 18-30, are merely exemplary and are not intended to be limiting beyond what is specifically recited in the claims that follow.

It is noted that a single device type is illustrated in the exemplary FIGS. 18-30. This device may be an NFET or PFET device. One of ordinary skill in the art would understand that devices of differing types may both benefit from the steps of the method 1700 and may be combined with those steps illustrated with reference to FIG. 1 and the corresponding exemplary figures to provide NFET and PFET devices upon the same substrate.

The method 1700 begins at block 1702 where a substrate is provided. Referring to the example of FIG. 18, in an embodiment of block 1702, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond.

Alternatively, the substrate 202 may include a compound semiconductor and/or an alloy semiconductor. Further, the substrate 202 may optionally include an epitaxial layer, may be strained for performance enhancement, may include a silicon-on-insulator (SOI) structure, and/or have other suitable enhancement features. In the example of FIG. 18, the device 1800 includes the substrate 202.

Block 1702 further includes forming epitaxial layers on the substrate 202. In an embodiment, a first layer and second epitaxial layer are formed on the substrate. By way of example, epitaxial growth of the layers may be performed by a molecular beam epitaxy (MBE) process, a metalorganic chemical vapor deposition (MOCVD) process, and/or other suitable epitaxial growth processes. With reference to the example of FIG. 18, in an embodiment of block 1702, a first epitaxial layer 1802 and a second epitaxial layer 1804 may be formed. The epitaxial layer 1802 includes a first composition; the epitaxial layer 1804 includes a second composition. The first and second composition can be different. In an embodiment, the epitaxial layer 1802 is SiGe and the epitaxial layer 1804 is silicon. However, other embodiments are possible including those that provide for a first composition and a second composition having different oxidation rates. The thickness of the epitaxial layer 1802 may be between approximately 10 nm and approximately 30 nm. The thickness of the epitaxial layer 1804 may be greater such that it provides for the active region of the device 1800.

In the example of FIG. 18, in an embodiment of block 1702, the substrate 202 also includes the hard mask layer 204 disposed thereon. The hard mask layer 204 may include an oxide layer (e.g., a pad oxide layer that may include $SiO_2$) and nitride layer (e.g., a pad nitride layer that may include $Si_3N_4$) formed over the oxide layer. The hard mask layer 204 may be substantially similar to as discussed above with reference to the method 100 and FIG. 2. In an embodiment, the method 1700 includes at block 1702 performing an anti-punch through (APT) implant(s) of the substrate 202 prior to the formation of the epitaxial layers 1802, 1804.

The method 1700 then proceeds to block 1704 where fin elements, used for subsequent FinFET formation, are formed on the substrate. With reference to the example of FIG. 19, in an embodiment of block 1704, a plurality of fin elements 1902 extending from the substrate 202 are formed. The fin elements 1902 may define the "active" regions of the substrate where the transistor(s) will be formed. The fin elements 1902 include a portion of the substrate 202, the epitaxial layer 1802, and the epitaxial layer 1804.

The fins 1902 may be fabricated using suitable processes including photolithography and etch processes. The photolithography process may include forming a photoresist layer over the substrate 202 (e.g., over the hard mask layer 204), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and the epitaxial layers 1802 and 1804 formed thereupon, while an etch process forms trenches in unprotected regions through the patterned hard mask layer 204 and into the substrate 202, thereby leaving the plurality of extending fins 1902. The trenches between fins 1902 may be etched using a dry etch (e.g., reactive ion etching), a wet etch, and/or other suitable processes. Numerous other embodiments of methods to form the fins on the substrate may also be used.

The method 1700 then proceeds to block 1705 where an oxidation process is performed to form an isolation layer within the fin element(s). In an embodiment of block 1705, the device is exposed to an oxidation process that fully oxidizes one of the epitaxial layers in each of the plurality of fin elements 1902. Referring to the example of device 1800, the epitaxial layer 1802 (FIG. 19) is transformed into an oxidized layer 2002, which provides an isolation region/layer. In some embodiments, the oxidized layer 2002 has a thickness range of about 5 to about 25 nanometers (nm). In an embodiment, the oxidized layer 2002 may include an oxide of silicon germanium (SiGeOx).

In some embodiments, the oxidation process of block 1705 is a selective oxidation due to the composition of epitaxial layer 1802. In some examples, the oxidation process may be performed by exposing the device 1800 to a wet oxidation process, a dry oxidation process, or a combination thereof. In at least some embodiments, the device 1800 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting.

As described above, in some embodiments, the first epitaxial layer portion 1802 may include a material having a first oxidation rate, and the second epitaxial layer portion 1804 may include a material having a second oxidation rate greater than the first oxidation rate. By way of example, in embodiments where the epitaxial layer portion 1802 includes SiGe, and where the epitaxial layer 1804 includes Si, the faster SiGe oxidation rate (i.e., as compared to Si) ensures that the SiGe layer (i.e., the epitaxial layer 1802) becomes fully oxidized while minimizing the oxidization of epitaxial layer 1804. It will be understood that other materials may also be selected for each of the epitaxial layers that provide different suitable oxidation rates. As illustrated in FIG. 20, a thin oxide layer 2004 may form on the fin elements 1902.

In some embodiments, the resultant oxidized layer 2002 of each of the fin elements 1902 can serve as a diffusion barrier to APT dopants previously implanted into the substrate 202, and which may be present in the substrate 202 directly below the oxidized layer 2002. Thus, in various embodiments, the oxidized layer 2002 serves to prevent APT dopants within the substrate portion 202 from diffusing for example, into the overlying epitaxial layer 1904, which can serve as a channel region for a subsequently formed device. In other embodiments, the oxidized layer 2002 is omitted.

The method 1700 then proceeds to block 1706 where isolation features are formed between the fin elements. The isolation features may be shallow trench isolation (STI) features. Block 1706 may be substantially similar to block 106 of the method 100 in FIG. 1. With reference to the example of FIG. 21, STI features 402 are disposed between the fins 1902. The STI features 402 may be substantially similar to as discussed above with reference to FIG. 4. As discussed above, in forming the STI features, after deposition of the dielectric layer(s), the deposited dielectric material thinned and planarized, for example by a chemical mechanical polishing (CMP) process. The CMP process may planarize the top surface thereby forming STI features 402 as illustrated in FIG. 21. As illustrated in FIG. 21, in some embodiments, the CMP process used to planarize the top surface of the device 1800 and form the STI features 402 may also serve to remove the hard mask layer 204 from each of the plurality of fin elements 1902. In some embodiments, removal of the hard mask layer 204 may alternately be performed by using a suitable etching process (e.g., dry or wet etching).

The method 1700 then proceeds to block 1710 where the STI features are recessed to expose the fin. Referring to the example of FIG. 22, the STI features 402 have been recessed providing fins 2202 respectively, extending above a top surface of the STI features 402. Block 1710 may be substantially similar to block 110 of the method 100 of FIG. 1. In some embodiments, a recessing depth is controlled (e.g., by controlling an etching time) so as to result in a desired height, H, of the exposed upper portion of the fin elements 2202. In an embodiment, the height H is between approximately 30 nanometers (nm) and approximately 60 nm. While FIG. 22 illustrates the recess of the STI feature 402 being substantially coplanar with a top surface of the oxidized layer 2002, in other embodiments this may not be required.

In an embodiment, the method 1700 then proceeds to block 1712 where one or more sacrificial layers are formed on the substrate. In an embodiment, a dummy dielectric (e.g., oxide) layer is formed on the substrate. The dummy insulating layer may be substantially similar to as discussed above at block 112 of the method 100 of FIG. 1. Referring to the example of FIG. 23, a dummy oxide 802 is disposed on the fins 2202. The dummy oxide 802 may be substantially similar to the dummy oxide 802, discussed above with reference to FIG. 8.

The method 1700 then proceeds to block 1714 where a dummy (also referred to as sacrificial) gate structure is formed on the fin elements. Block 1714 may be substantially similar to block 114 of the method 100 of FIG. 1. Using the example of FIG. 24, a gate structure 902 is disposed on the fins 2202. In an embodiment, the gate structure 902 is a dummy (sacrificial) gate stack that is subsequently removed as discussed below. The gate structure 902 may be substantially similar to the gate stack 902, discussed above with reference to FIGS. 9A and 9B. In some embodiments, the dummy gate structure 902 includes the dielectric layer 802, an electrode layer 904, and a hard mask layer 906 which may include multiple layers 908 and 910 (e.g., an oxide layer 908 and a nitride layer 910). As discussed above, in some embodiments, the electrode layer 904 of the gate structure 902 may include polycrystalline silicon (polysilicon). In some embodiments, the hard mask layer 906 includes an oxide layer 908 such as a pad oxide layer that may include $SiO_2$. In some embodiments, hard mask layer 906 includes the nitride layer 910 such as a pad nitride layer that may include $Si_3N_4$, silicon oxynitride or alternatively include silicon carbide. The gate structure 902 may define a channel region of the fin elements 2202 (e.g., that portion directly underlying the gate structure 902) and opposing source/drain regions of the fin elements 2202.

The method 1700 then proceeds to block 1716 where the dummy oxide layer is removed from the source/drain regions of the fin elements. Block 1716 may be substantially similar to block 116 of the method 100 of FIG. 1. Referring to the example of FIG. 25, the dummy oxide 802 has been removed from the source/drain regions of the fin elements 2202.

The method 1700 then proceeds to block 1718 where spacer elements are formed on the substrate including the sidewalls of the dummy gate structure. Block 1718 may be substantially similar to block 118 of the method 100 of FIG. 1. Referring to the example of FIG. 26, a spacer layer 1102 is disposed on the substrate 202. The spacer layer may be substantially similar to the spacer layer 1102 described above with reference to FIGS. 11A and 11B.

After deposition of the dielectric material forming the spacer layer, block 1718 may continue to be followed by an etching back of the dielectric material. Referring to the example of FIG. 27, the spacer material layer 1102 has been etched back to expose the source/drain regions of the fins. The spacer material layer 1102 remains on the sidewalls of the gate structure 902.

In some embodiments, the method 1700 proceeds to block 1720 where the fin elements are trimmed (e.g., decreased in width). Block 1720 may be substantially similar to block 120 of the method 100 of FIG. 1. Referring to the example of FIG. 27, the exposed portion of the fin elements 2202 have been etched or trimmed, to reduce their width. In an embodiment, approximately 1 nm to approximately 12 nm of width is removed from the exposed fins 2202. In a further embodiment, approximately 2 nm of width of the fins 2202 are trimmed (e.g., removed). In an embodiment of the method 1700, block 1720 is omitted and the fins are not trimmed.

In an embodiment, the trimming process includes exposing the fins 2202 to an ozone environment such that a portion of the fins 2202 (e.g., silicon, silicon germanium) is oxidized. The oxidized portion is then removed through a cleaning or etching process such as discussed above with reference to block 1716 of the method 1700. Additional example etchants used for the trimming process may include a mixture of sulfuric acid ($H_2SO_4$) and hydrogen peroxide ($H_2O_2$) (known as a sulfuric peroxide mixture (SPM)), a mixture of ammonium hydroxide ($NH_4OH$), $H_2O_2$, and water ($H_2O$) (known as an ammonia-peroxide mixture (APM)), a mixture of $NH_4OH$ and $H_2O_2$, $H_2O_2$, and/or other etchants as known in the art. Alternatively, in some embodiments, the trimming process may include a dry etching process or a combination of a dry/wet etching process.

As described in further detail with reference to FIGS. 30 and 31, the width of the fin below the top of the STI feature is not exposed and thus, not trimmed. This results in a difference of widths within the fins 2202. Similarly, in some embodiments, the fins 2202 are not trimmed in the channel region, which underlie the gate structure 902.

The method 1700 then proceeds to block 1722 where an epitaxial growth process forms source/drain features on the fin elements. The source/drain features may be formed by performing an epitaxial growth process that provides an epitaxy material cladding the fin element's source/drain regions. The epitaxial regions of the NFET and PFET devices may be grown in different processes or the same processes and/or include different materials and/or dopants or dopant profiles.

Figure 28:
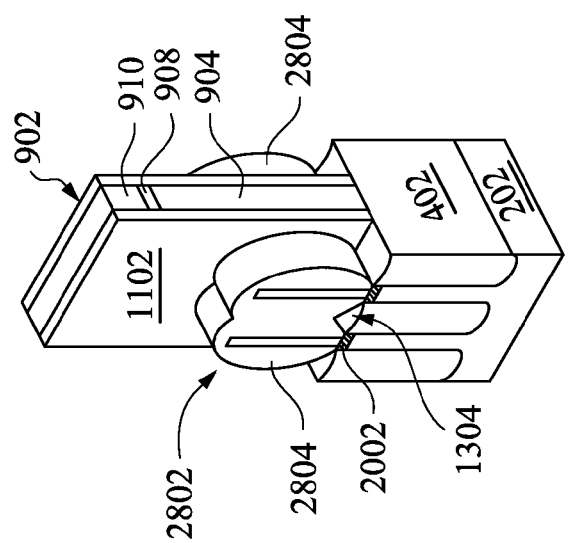
Figure 27:
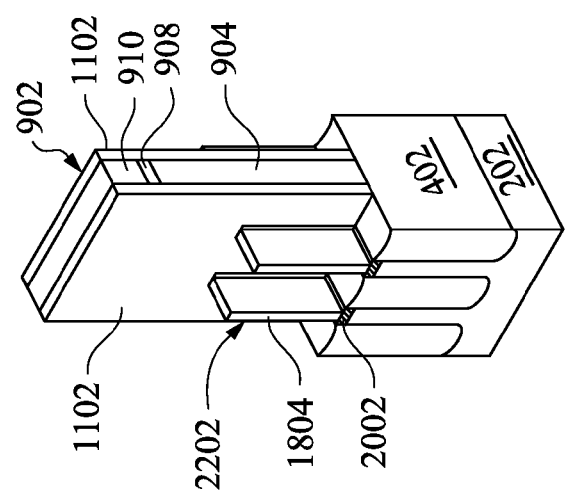
Figure 26:
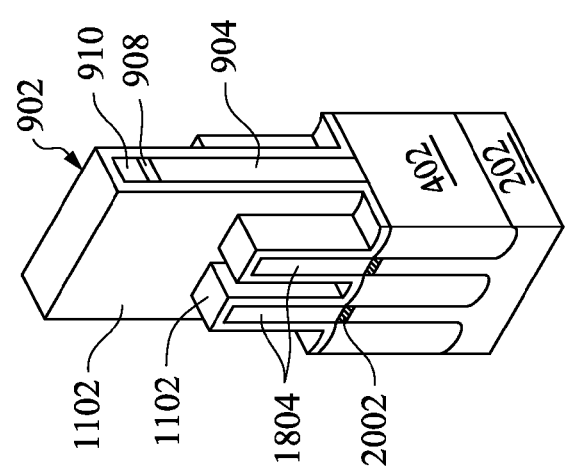

Referring to the example of FIG. 28, source/drain features 2802 are formed on the substrate 202 on the fins 2202 adjacent to the gate stack 902. The source/drain features 2802 may be substantially similar to the source/drain features 1302, described above with reference to FIGS. 13A, 13B. For example, the source/drain features 2802 for the device 1800 include material 2804 formed by epitaxially growing a semiconductor material on the exposed fin 2202. In other words, the material 2804 is formed around the exposed fin 2202 adjacent the gate 902; this may be referred to as forming a "cladding." Additionally, the source/drain features 2802 for the device 1800 include material 2804 formed by epitaxially growing a semiconductor material on the exposed fin 2202. In other words, the material 2804 is formed around or "cladding" the exposed fin 2202. In various embodiments, the grown semiconductor material 2804 may include Ge, Si, GaAs, AlGaAs, SiGe, GaAsP, SiP, or other suitable material. In some embodiments, the material 2804 may be in-situ doped during the epitaxial process. In some embodiments, the epitaxially grown material 2804 is not in-situ doped, and, for example, instead an implantation process is performed to dope the epitaxially grown material 2804.

The fins 2202 and the epitaxial material 2804 may comprise the same or different material, the same or different doping, and/or the same or different percentage composition of a given material. The epitaxial material 2804 may be substantially similar to the epitaxial material 1302A and/or 1302B, described above with reference to FIGS. 13A and 13B.

In an embodiment, the fin element 2202 is silicon and the epitaxially grown material 2804 also is silicon for a first type of device 1800 (e.g., NFET). In an embodiment, for a first type of device 1800 the epitaxially grow material includes an N-type dopant such as phosphorous. In a further embodiment, the phosphorous dopant concentration may be between approximately $5 \times 10^{20}$ and approximately $2 \times 10^{21}$ atoms per $cm^3$. The epitaxially grown material 2804 may be alternatively suitably doped to include arsenic, antimony, or other N-type donor material.

In an embodiment, the fin element 2202 is silicon and the epitaxially grown material 2804 is silicon germanium for a second type of device 1800 (e.g., PFET). In a further embodiment, the epitaxially grown material 2804 may be $Si_{1-x}Ge_x$ with a germanium percent composition of between approximately 50% and 100% (i.e., x is between 0.5 and 1). The epitaxially grown material 2804 for a device 1800 of a second type may be suitably doped with a P-type dopant material such as boron. For example, the boron dopant concentration may be between approximately $5 \times 10^{20}$ and approximately $2 \times 10^{21}$ atoms per $cm^3$. Thus, in an embodiment, the epitaxially grown material 2804 is SiGe with between 50% and 100% germanium composition, the fin 2204 is Si composition, the epitaxially grown material 2804 has a dopant concentration (e.g., boron) of between approximately $5 \times 10^{20}$ and approximately $2 \times 10^{21}$ atoms per $cm^3$.

Upon completion of the growth process, the epitaxially grown material 2804 may have a curvilinear surface. A curvilinear surface is illustrated by the sidewalls of the epitaxial grown material 2804 in FIG. 28. The curvilinear surface may be formed by using a plurality of epitaxial growth processes, where each deposition is followed by an etching process. This is discussed in greater detail above with reference to the method 100 at block 122.

The formation of the source/drain features 2804 also provide for formation of a gap 1304. The gap 1304 may be filled with air and thus, referred to as an "air-gap." The air-gap 1304 has a relatively triangular-shape in the cross-section defined by the curvilinear edges of the respective epitaxial features 2804 and a top surface of the STI feature 402.

The method 1700 then proceeds to block 1724 where an inter-layer dielectric (ILD) layer is formed on the substrate. Block 1724 may be substantially similar to block 124 of the method 100 of FIG. 1. Referring to FIG. 29, in an embodiment of block 1724, an ILD layer 1402 is formed over the substrate 202. In some embodiments, a contact etch stop layer (CESL) is also formed over the substrate 202 prior to forming the ILD layer 1402. The ILD layer 1402 may be substantially similar to as discussed above with reference to FIGS. 14A, 14B. In some examples, after depositing the ILD layer, a planarization process (e.g., CMP) may be performed to expose a top surface of the dummy gate stack, including, for example, removing the hard mask 906.

The method 1700 then proceeds to block 1726 where a replacement gate structure is formed. Block 1726 of the method 1700 includes removing the dummy gate structure or portion thereof and replacing it with a functional gate, for example, a high-k/metal gate stack. Block 1726 may be substantially similar to block 126 of the method 100 of FIG. 1. Referring to example of FIG. 30, the previously formed dummy gate structure 902 (e.g., the dielectric layer 802 and the electrode layer 904) is removed from the substrate. The removal of the dielectric layer 802 and the electrode layer 904 of the gate structure 902 results in an opening or trench. A final gate structure 1502 (e.g., including a high-K dielectric layer and metal gate electrode) may be subsequently formed in the trench or opening, as described below. The removal and formation of the final gate structure 1502 (e.g., high-k/metal gate) may be substantially similar to as discussed above with reference to block 126 of the method 100 of FIG. 1 and the gate structure 1502 of FIGS. 15A, 15B.

Figures 29, 30:
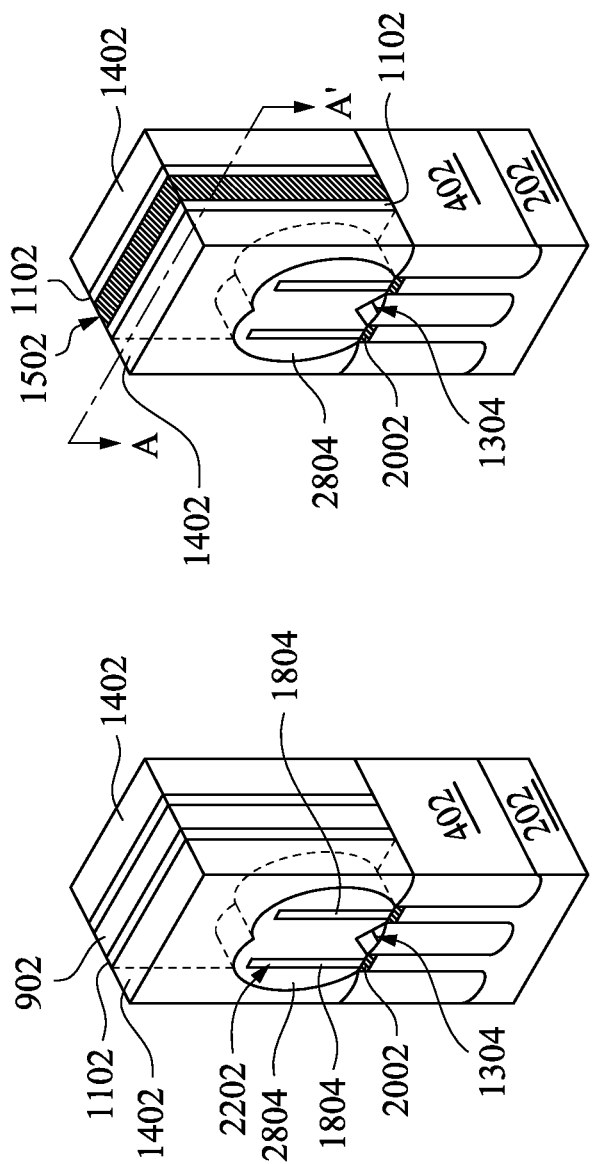

Referring now to FIG. 31, illustrated is the cross-sectional views of the device 1800, respectively along a plane cut as indicated in AA' of FIG. 30 respectively. In particular, FIG. 31 illustrates the cross-section of the source/drain region of the device 1800 respectively. The device 1800 may be a first type (e.g., NFET) or second type (e.g., PFET) of device.

The following discussion presents exemplary dimensions for various elements of the features of embodiments of the device 1800. These dimensions are exemplary only and not intended to be limiting beyond what is specifically recited in the claims that follow. With reference to FIG. 31, in an embodiment, the fin width Fw1 is between approximately 6 nm and approximately 14 nm. This dimension may be determined by the lithography and patterning steps used to define the fin elements as discussed above with reference to block 1704 of the method 1700. In an embodiment, Fw1 is also the width of the fin in the channel region underlying gate structure 1502. In an embodiment, the upper fin width Fw2 is between approximately 2 nm and approximately 6 nm. The fin width Fw2 is determined by the trim process described above with reference to block 1720 applied to the fin elements defined as discussed above with reference to block 1704 of the method 1700. A width Fw2 less than the width Fw1 may be provide, for example, for a benefit of allowing for ease of epitaxial growth between fin elements 2202. The distance between fins 2202 or width of the STI features 402 is S, which in an embodiment may be between approximately 10 nm and 20 nm. In a further embodiment, S is approximately 16 nm. The fin element 2202 has a height H above a top surface of the STI feature 402; in an embodiment, H is between approximately 30 nm and approximately 60 nm.

The air-gap 1304 may be approximately triangular in cross-section with a height Hgap and a bottom side defined by the STI feature 402 having a length S. In an embodiment, Hgap is between approximately 10 nm and approximately 15 nm. Therefore, the Hgap may be between approximately 10% and approximately 40% of the height of the exposed fin HA.

In an embodiment, the thickness Ti of the isolation region 2002 is between approximately 10 nm and approximately 30 nm.

In an embodiment, the device 1800 is an NMOS device (NFET). In a further embodiment, the NFET may include the epitaxial material 2202 comprising silicon doped with phosphorous formed on silicon fin 2202. Exemplary phosphorous dopant concentrations include those between approximately $5 \times 10^{20}$ and approximately $2 \times 10^{21}$ atoms per $cm^3$.

In an embodiment, the device 1800 is a PMOS device (PFET). In a further embodiment, the PFET may include the epitaxial material 2202 comprising silicon germanium doped with boron formed on a silicon fin 2202. Exemplary boron dopant concentrations include those between approximately $5 \times 10^{20}$ and approximately $2 \times 10^{21}$ atoms per $cm^3$. Exemplary germanium elemental percentages in the silicon germanium include those between approximately 50% and approximately 100% (e.g., germanium).

The semiconductor devices 1800 may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1700, and some process steps described above may be replaced or eliminated in accordance with various embodiments of the method 1700.

It is also noted that the exemplary figures illustrate two fins for the device 1800, however any number of fins is possible and any number of fins may be associated with a given gate structure.

Thus, in an embodiment provided is a method of semiconductor fabrication that includes providing a plurality of fins extending from a substrate. Each of the plurality of fins has a top surface and two opposing lateral sidewalls. A gate structure is formed over a first region of each of the plurality of fins and interfaces the top surface and the two opposing lateral sidewalls. A source/drain epitaxial feature is formed on a second region of each of the plurality of fins. The source/drain epitaxial feature interfaces the top surface and the two opposing lateral sidewalls. An air gap is provided which is defined by at least one surface of the source/drain epitaxial feature.

In another embodiment, a method includes providing a substrate having a first fin and a second fin extending from the substrate and an isolation feature interposing the fins. Using an epitaxial process, an epitaxial layer is deposited over the first fin and the second fin. The epitaxial layer has a first surface disposed on the first fin and an opposing second curvilinear surface. An air-gap is formed underlying the epitaxial layer and defined by the epitaxial layer and a top surface of the isolation feature.

In other embodiments presented herein, provided is a semiconductor device including a first fin element and a second fin element having a shallow trench isolation feature there between. A gate structure is disposed on the first and second fins. A source/drain epitaxy material is disposed on each of the first fin and the second fin elements adjacent the gate structure. The source/drain epitaxy material has a curvilinear surface that extends from a top surface of the STI feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
    providing a plurality of fins extending from a substrate, wherein each of the plurality of fins has a top surface and two opposing lateral sidewalls;
    forming a gate structure over a first region of each of the plurality of fins wherein the gate structure interfaces the top surface and the two opposing lateral sidewalls;
    after forming the gate structure, trimming each of the plurality fins in a second region, wherein the trimming decreases a width of each of the plurality of fins in the second region;
    forming a source/drain epitaxial feature on the second region of each of the plurality of fins after the trimming, wherein the source/drain epitaxial feature interfaces sidewalls of the plurality of trimmed fins, wherein the forming the source/drain epitaxial feature includes:

performing a first epitaxial growth process;
performing a first etching process after the first epitaxial growth process;
performing a second epitaxial growth process after the first etching process; and
performing a second etching process after the second epitaxial growth process thereby forming the source/drain epitaxial feature having a curvilinear surface; and
providing an air gap over the substrate and defined by at least one surface of the source/drain epitaxial feature.

2. The method of claim 1, further comprising: forming an interlayer dielectric over the source/drain epitaxial feature and the air gap.

3. The method of claim 1,
wherein the trimming each of the plurality of fins providing for each of the plurality of fins to have a first width in the second region below a top surface of a shallow trench isolation feature and a second width less than the first width in the second region above the top surface of the shallow trench isolation feature.

4. The method of claim 1, further comprising:
prior to forming the plurality of fins, forming an epitaxial layer on the substrate, wherein each of the plurality of fins includes the epitaxial layer; and
after patterning the plurality of fins, oxidizing the epitaxial layer to form an oxidized region, wherein the oxidized region underlies the source/drain epitaxial feature.

5. The method of claim 1, wherein top surface and two opposing sidewalls are silicon surfaces and the forming the epitaxial feature includes growing a silicon germanium material on the silicon surfaces of each of the trimmed fins.

6. The method of claim 1, wherein the top surface and the two opposing sidewalls are silicon surfaces and the growing the epitaxial feature includes growing a silicon epitaxy material on the silicon surfaces of each of the trimmed fins.

7. The method of claim 1, wherein the forming the source/drain epitaxial surface forms the curvilinear surface directly on a spacer element of the gate structure.

8. The method of claim 1, wherein the plurality of fins includes a first fin and a second fin, the source/drain epitaxial feature including a contiguous region between the first and second fin, and wherein the air gap is formed under the contiguous region.

9. The method of claim 1, wherein the forming the gate structure includes forming a high-k dielectric and metal gate electrode.

10. A method of semiconductor fabrication, comprising:
providing a substrate having a first fin and a second fin extending from the substrate and an isolation feature interposing the first and second fins;
reducing a width of the first fin and the second fin by a trimming process;
using an epitaxial process, depositing an epitaxial layer over the first fin and the second fin after the trimming process wherein the depositing the epitaxial layer includes at least one of introducing an etchant precursor during the depositing and performing an etching process between portions of the epitaxial process, wherein the epitaxial process forms the epitaxial layer having a first surface disposed on the first fin and an opposing second curvilinear surface; and forming an air-gap underlying the epitaxial layer and over the isolation feature, wherein the air-gap has an edge defined by the epitaxial layer.

11. The method of claim 10, wherein the
trimming process provides a first width of the first fin and the second fin prior to forming the epitaxial layer above the isolation feature and a second width of the first and second fin below the isolation feature, the second width greater than the first width.

12. The method of claim 10, wherein the trimming process forms a top surface and two opposing sidewalls of the first fin, wherein the two opposing sidewalls extend from the top surface and are substantially perpendicular to the top surface of the isolation feature; and
the epitaxial layer is deposited directly on the top surface and the two opposing sidewalls of the first fin.

13. The method of claim 10, wherein the first and second fins are silicon; and wherein the depositing the epitaxial layer includes growing a layer including germanium.

14. The method of claim 10, further comprising:
removing a portion of each of the first fin and the second fin having a first composition to create a recess; and
using another epitaxial growth process, forming a second composition in the recesses prior to depositing the epitaxial layer.

15. The method of claim 14, wherein the first composition is silicon and the forming the second composition includes depositing a material comprising germanium (Ge).

16. A method of semiconductor device fabrication, comprising:
providing a first fin and a second fin having a first width extending from a substrate, wherein a shallow trench isolation (STI) feature interposes the first and second fins;
forming a gate structure over a first region of each of the first and second fins, wherein the gate structure is formed over the first and second fins having the first width;
trimming the first and second fins in a second region adjacent the gate structure and above the STI feature to provide a second width of each of the first and second fins, wherein the second width is less than the first width, wherein the trimming includes:
oxidizing the first and second fins of the first width to form an oxidize portion of each of the first and second fins; and
removing the oxidized portions of the first and second fins;
forming a source/drain epitaxial feature in the second region on the first and second fins having the second width; and
wherein the forming the source/drain provides an air gap over the substrate and defined by at least one surface of the source/drain epitaxial feature.

17. The method of claim 16, wherein the forming the source/drain epitaxial feature includes:
introducing an etchant precursor in-situ with an epitaxial growth process to form a circulinear surface of the source/drain epitaxial feature.

18. The method of claim 16, wherein the forming the source/drain epitaxial feature includes:
performing a plurality of epitaxial growth processes, where each of the plurality of epitaxial growth processes is followed by an etching process.

* * * * *